(12) United States Patent
Yoon et al.

(10) Patent No.: US 12,591,175 B2
(45) Date of Patent: Mar. 31, 2026

(54) SUBSTRATE TREATING APPARATUS AND SUBSTRATE TREATING METHOD

(71) Applicant: SEMES CO., LTD., Chungcheongnam-do (KR)

(72) Inventors: Hyun Yoon, Gyeonggi-do (KR); Ki Hoon Choi, Chungcheongnam-do (KR); Hyo Won Yang, Seoul (KR); Tae Hee Kim, Gyeonggi-do (KR); In Ki Jung, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 180 days.

(21) Appl. No.: 18/066,380

(22) Filed: Dec. 15, 2022

(65) Prior Publication Data

US 2023/0205091 A1 Jun. 29, 2023

(30) Foreign Application Priority Data

Dec. 28, 2021 (KR) ........................ 10-2021-0189890

(51) Int. Cl.
*G03F 7/20* (2006.01)
*G03F 1/44* (2012.01)
*B23K 26/08* (2014.01)
*H10P 72/50* (2026.01)

(52) U.S. Cl.
CPC .............. *G03F 7/2041* (2013.01); *G03F 1/44* (2013.01); *B23K 26/0892* (2013.01); *H10P 72/50* (2026.01)

(58) Field of Classification Search
CPC .................................................. G03F 7/2041
See application file for complete search history.

(56) References Cited

U.S. PATENT DOCUMENTS 5,459,000 A * 10/1995 Unno .................. G03F 7/70583
430/311
6,888,096 B1 * 5/2005 Hamada ............. B23K 26/0738
219/121.7

(Continued)

FOREIGN PATENT DOCUMENTS

KR 10-2003-0025060 A 3/2003
KR 10-2018-0127150 A 11/2018

(Continued)

OTHER PUBLICATIONS

English machine translation of KR 10-2019-0037379, retrieved from EPO database Jan. 9, 2025 (Year: 2025).*

(Continued)

*Primary Examiner* — Timothy Kennedy
(74) *Attorney, Agent, or Firm* — Carter, DeLuca & Farrell LLP

(57) ABSTRACT

Disclosed is a substrate treating apparatus including a support unit that supports and rotates a substrate, a heating unit including a laser irradiator that irradiates laser light in a pattern formed in the substrate, a movement module that changes a location of the laser irradiator by moving the heating unit, and a controller that controls the support unit and the heating unit, the movement module moves the heating unit between a heating location, at which the laser light is irradiated to the substrate, and a standby location that deviates from the substrate, and the movement module rotates and linearly moves the heating unit.

10 Claims, 17 Drawing Sheets

(56)                    References Cited

U.S. PATENT DOCUMENTS

| | | | |
|---|---|---|---|
| 7,027,381 B1 * | 4/2006 | Nagasaka | G03F 7/70383 |
| | | | 369/44.14 |
| 2006/0086898 A1 * | 4/2006 | Cheng | G03F 7/70316 |
| | | | 250/236 |
| 2010/0154558 A1 * | 6/2010 | Desplats | B23K 26/348 |
| | | | 73/842 |
| 2015/0160550 A1 * | 6/2015 | Kim | G03F 1/24 |
| | | | 430/5 |
| 2017/0160645 A1 * | 6/2017 | Li | G02B 6/3616 |
| 2017/0292825 A1 * | 10/2017 | Haight | G01B 11/026 |
| 2019/0047228 A1 * | 2/2019 | Brown | G05B 19/4015 |
| 2020/0057376 A1 * | 2/2020 | Hsu | G03F 7/2053 |
| 2020/0086388 A1 * | 3/2020 | Zediker | B23K 26/032 |
| 2021/0229215 A1 * | 7/2021 | Weston | B23K 26/0608 |
| 2023/0185206 A1 * | 6/2023 | Kim | G03F 1/80 |
| | | | 156/345.19 |

FOREIGN PATENT DOCUMENTS

| | | | |
|---|---|---|---|
| KR | 10-2019-0037379 A | 4/2019 | |
| KR | 10-2020-0088794 A | 7/2020 | |

OTHER PUBLICATIONS

Korean Office Action issued in corresponding KR Patent Application No. 10-2021-0189890, dated Apr. 24, 2024, with English translation.

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0189890 filed on Dec. 28, 2021, in the Korean Intellectual Property Office, the entire contents of which are hereby incorporated by reference.

BACKGROUND

Embodiments of the inventive concept described herein relate to a substrate treating apparatus and a substrate treating method.

To manufacture a semiconductor device, various processes, such as photographing, etching, ashing, injection of ions, and deposition of thin films, are performed on a substrate, such as a wafer. In the processes, various treatment liquids and treatment gases are used. Furthermore, a process of drying the substrate is performed to remove the treatment liquid used to treat the substrate from the substrate.

The photographing process of forming a pattern on the wafer includes an exposure process. The exposure operation is a preliminary operation for directly shaving off a semiconductor material attached on the wafer into a pattern. The exposure process may have various purposes, such as formation of a pattern for etching and formation of a pattern for injection of ions. In the exposure process, a pattern is drawn on the wafer with light by using a mask that is a kind of frame. When light is directly exposed to a semiconductor material on the wafer, for example, a resist on the wafer, chemical properties of the resist are changed according to a pattern due to the light and the mask. When a development liquid is supplied to the resist, the chemical properties of which are changed according to the pattern, a pattern is formed on the wafer.

To precisely perform the exposure process, the pattern formed on the mask has to be precisely manufactured. To identify whether the pattern has a desired shape and whether the pattern is formed precisely, an operator inspects the formed pattern by using inspection equipment, such as a scanning electronic microscope (SEM). However, because a plurality of pattern are formed in one mask, all of the plurality of patterns have to be inspected to inspect the one mask. Accordingly, much time has to be taken for inspection of the mask.

Accordingly, a monitoring pattern that may represent one pattern group including a plurality of pattern is formed in the mask. Furthermore, an anchor pattern that may represent a plurality of pattern groups is formed in the mask. An operator may estimate qualities of the patterns formed in the mask through inspection of the anchor pattern. Furthermore, the operator may estimate qualities of the patterns included in one pattern group through inspection of the monitoring pattern.

In this way, through the monitoring pattern and the anchor pattern formed in the mask, the operator may effectively shorten a time for inspection of the mask. However, to increase a precision of inspection of the mask, it is preferable that line widths of the monitoring pattern and the anchor pattern are the same.

When etching is performed to make the line widths of the monitoring pattern and the anchor pattern the same, the patterns may be excessively etched. For example, a difference between an etching rate for the line width of the monitoring pattern and an etching rate for the line width of the anchor pattern may occur several times, and in a process of repeatedly etching the monitoring pattern and/or the anchor pattern to reduce the differences, over-etching may be generated in the line width of the monitoring pattern and the line width of the anchor pattern. When an etching process is precisely performed to minimize over-etching, much time is taken in the etching process. Accordingly, a line width correcting process for precisely connecting the line widths of the patterns formed in the mask is additionally performed.

FIG. 1 shows normal distributions of a first line width CDP1 of the monitoring pattern and the anchor pattern CDP2 of a mask before, among the mask manufacturing processes, a line width correcting process is performed. Furthermore, the first line width CDP1 and the second line width CDP2 are line widths that are smaller than a target line width. Line widths (critical dimensions) of the monitoring pattern and the anchor pattern have a deviation on purpose before the line width correcting process is performed. Furthermore, the line widths of the two patterns are made to be the same by additionally etching the anchor pattern in the line width correcting process.

When the anchor pattern is over-etched as compared with the monitoring pattern in the process of additionally etching the anchor pattern, the line widths of the monitoring pattern and the anchor pattern become different whereby the line widths of the pattern formed in the mask cannot be corrected. Accordingly, when the anchor pattern is additionally etched, the anchor pattern has to be precisely etched.

SUMMARY

Embodiments of the inventive concept provide a substrate treating apparatus that may efficiently treat a substrate, and a substrate treating method.

Embodiments of the inventive concept provide a substrate treating apparatus that may make line widths of pattern formed on a substrate uniform, and a substrate treating method.

Embodiments of the inventive concept provide a substrate treating apparatus that may precisely etch specific pattern formed on a substrate, and a substrate treating method.

Embodiments of the inventive concept provide a substrate treating apparatus that may minimize a structure of a heating unit that irradiates laser light onto a substrate, and a substrate treating method.

Embodiments of the inventive concept provide a substrate treating apparatus that may minimize a movement stroke when a heating unit that irradiates laser light onto a substrate is moved to a target location, and a substrate treating method.

Embodiments of the inventive concept provide a substrate treating apparatus that may reduce a size of a heating unit that irradiates laser light onto a substrate, and a substrate treating method.

Embodiments of the inventive concept provide a substrate treating apparatus that may maximize a spatial utility in a liquid treatment chamber through reduction of a size of a heating unit, and a substrate treating method.

The problems that are to be solved by the inventive concept are not limited to the above-mentioned problems, and the unmentioned problems will be clearly understood by those skilled in the art, to which the embodiments of the inventive concept pertain, from the specification and the accompanying drawings.

An embodiment of the inventive concept provides a substrate treating apparatus. The substrate treating apparatus includes a support unit that supports and rotates a substrate, a heating unit including a laser irradiator that irradiates laser light in a pattern formed in the substrate, a movement module that changes a location of the laser irradiator by moving the heating unit, and a controller that controls the support unit and the heating unit, the movement module moves the heating unit between a heating location, at which the laser light is irradiated to the substrate, and a standby location that deviates from the substrate, and the movement module rotates and linearly moves the heating unit.

The movement module may include a perpendicular movement part that linearly moves the heating unit, and a rotation part that rotates the heating unit.

The perpendicular movement part may include a first driver that moves the heating unit in a first direction, and a second driver that moves the heating unit in a second direction that is perpendicular to the first direction.

The movement module may further include a shaft, and the shaft may be disposed between the perpendicular movement part and the rotation part.

The laser irradiator may be disposed at one end of a bottom surface of the heating unit, the rotation part may be disposed at an opposite end of the bottom surface of the heating unit, and the movement module may rotate the heating unit while the shaft is taken as an axis thereof.

The substrate may include a plurality of division surfaces, the pattern may be located on any one of the plurality of division surfaces of the substrate, and the controller may rotate the support unit such that the division surface of the substrate, on which the pattern is located, is located in an area that is adjacent to the heating unit.

The laser irradiator may be moved by the first driver by a first movement distance in the first direction, and the first movement distance may correspond to a length of the one of the plurality of division surfaces of the substrate in the first direction.

The laser irradiator may be moved by the second driver by a second movement distance in the second direction, and the second movement distance may correspond to a length of the one of the plurality of division surfaces of the substrate in the second direction.

The pattern formed in the substrate may include a first pattern, and a second pattern that is different from the first pattern, and the laser irradiator may irradiate the laser light to, among the first pattern and the second pattern, the second pattern.

The substrate may have a plurality of cells, the first pattern may be formed in the plurality of cells, and the second pattern may be formed on an outer side of the area, in which the plurality of cells are formed.

The controller may control the heating unit such that a deviation between a line width of the first pattern and a line width of the second pattern is minimized by irradiating the laser light to the second pattern.

The first pattern may be a monitoring pattern of an exposure pattern formed in the cell, and the second pattern may be a condition setting pattern of the substrate treating apparatus.

The controller may control the movement module such that the heating unit is moved perpendicularly after being rotated.

An embodiment of the inventive concept provides a method for treating a substrate having a first pattern and a second pattern that is different from the first pattern, by etching the substrate. The method includes a location correcting operation of moving the second pattern to a treatment location, a liquid treatment operation of supplying a treatment liquid onto the substrate, and a heating operation of irradiating the laser light to the second pattern moved to the treatment location, by the heating unit, in a state, in which the treatment liquid resides on the substrate, in the heating operation, the movement module moves the heating unit such that the laser irradiator of the heating unit is arranged in a direction that is perpendicular to the second pattern, and the movement module rotates and linearly moves the heating unit.

The substrate may include first to fourth quadrants, the second pattern may be located in any one of the first to fourth quadrants, and the treatment location may be one of first to fourth quadrant areas, in which the first to fourth quadrants are located, which is closest to the heating unit, when viewed from a top.

The heating operation may include a first movement operation of rotating the heating unit, by the movement module, such that the laser irradiator of the heating unit is located in a quadrant area that is closest to the heating unit, a second movement operation of linearly moving the heating unit, by the movement module, such that the laser irradiator is located at a location of the second pattern, and an irradiation operation of irradiating the laser light to the second pattern through the laser irradiator, by the heating unit.

The movement module may include a perpendicular movement part that linearly moves the heating unit, and a rotation part that rotates the heating unit, the perpendicular movement part may include a first driver that linearly moves the heating unit in a first direction and a second driver that moves the heating unit in a second direction that is perpendicular to the first direction, a maximum stroke distance of the first driver may be a first movement distance, a maximum stroke distance of the second driver may be a second movement distance, the first movement distance may correspond to a length of any of the first to fourth quadrants in the first direction, and the second movement distance may correspond to a length of any of the first to fourth quadrants in the second direction.

The heating operation may include minimizing a line width of the first pattern and a line width of the second pattern by irradiating the laser light to the second pattern.

The substrate may have a plurality of cells, the first pattern may be formed in the plurality of cells, the second pattern may be formed on an outside of an area, in which the plurality of cells are formed, and the first pattern may be a monitoring pattern of an exposure pattern formed in the cell, and the second pattern is a condition setting pattern of a substrate treating apparatus, on which the method is performed.

An embodiment of the inventive concept provides a substrate treating apparatus having a first pattern, and a second pattern that is different from the first pattern. The substrate treating apparatus includes a support unit that supports and rotates a substrate, a liquid supplying unit that supply a treatment liquid to the substrate supported by the support unit, a heating unit that irradiates laser light through a laser irradiator in the second pattern, a movement module that rotates and linearly moves the heating unit such that the laser irradiator is located in the second pattern, and a controller, the controller controls the movement module such that the heating unit is linearly moved after being rotated, the movement module includes a rotation part that rotates the heating unit, and a perpendicular movement part including a first driver that linearly moves the heating unit in a first direction and a second driver that linearly moves the heating unit in a second direction that is perpendicular to the first direction, a maximum stroke distance of the first driver is a distance corresponding to a half of a length of the substrate in the first direction, and a maximum stroke distance of the second driver is a distance corresponding to a half of a length of the substrate in the second direction.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a view schematically illustrating an embodiment of the liquid treatment chamber of FIG. 2;

FIG. 5 is a view of the liquid treatment chamber of FIG. 4, when viewed from a top;

FIGS. 12 and 13 are views illustrating an appearance of the substrate treating apparatus that performs a location correcting operation of FIG. 10;

FIG. 14 is a view illustrating an appearance of the substrate treating apparatus that performs a liquid treating operation of FIG. 10;

FIG. 16 is a view illustrating an appearance of a substrate treating apparatus that performs a rotation operation of FIG. 15;

FIG. 17 is a view illustrating an appearance of a substrate treating apparatus that performs a first linear movement operation of FIG. 15;

FIG. 18 is a view illustrating an appearance of a substrate treating apparatus that performs a second linear movement operation of FIG. 15; and FIG. 19 is a view illustrating an appearance of a substrate treating apparatus that performs a laser light irradiating operation of FIG. 15

DETAILED DESCRIPTION

Figure 1:
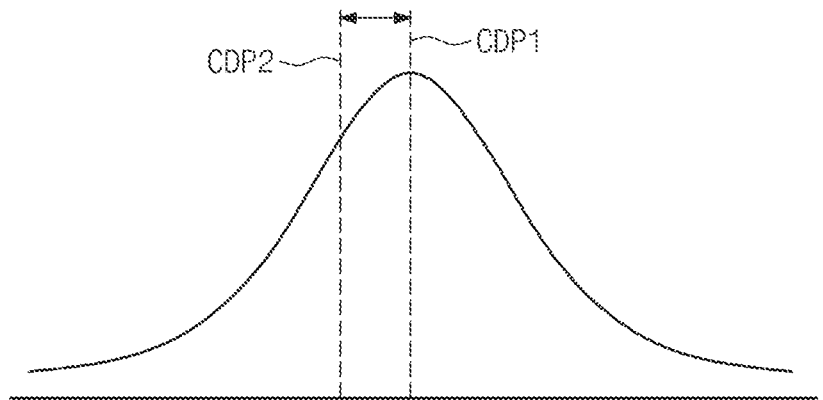
FIG. 1 is a view illustrating a normal distribution of a line width of a monitoring pattern and a line width of an anchor pattern.

Hereinafter, exemplary embodiments of the inventive concept will be described in more detail with reference to the accompanying drawings. The embodiments of the inventive concept may be modified in various forms, and the scope of the inventive concept should not be construed to be limited due to the following embodiments. The embodiments of the inventive concept are provided to describe the inventive concept for those skilled in the art more completely. Accordingly, the shapes and the like of the components in the drawings are exaggerated to emphasize clearer descriptions.

The terms such as first and second may be used to describe various components, but the components are not limited to the terms. The terms may be used only for the purpose of distinguishing one component from another component. For example, while not deviating from the scope of the inventive concept, a first component may be named a second component, and similarly, the second component may be named the first component.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described in detail with reference to FIGS. 2 to 19.

Figure 2:
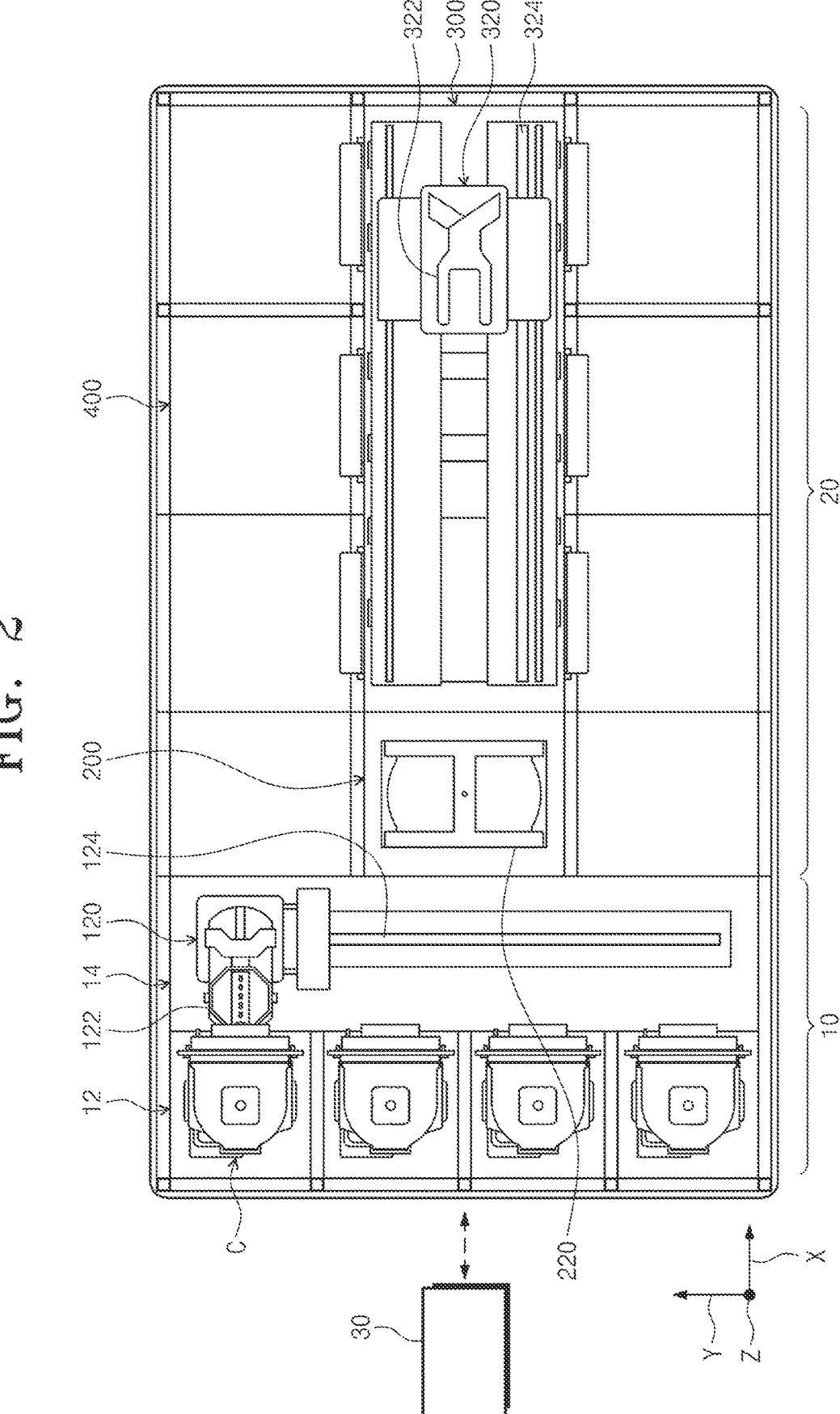
FIG. 2 is a plan view schematically illustrating a substrate treating apparatus according to an embodiment of the inventive concept.

FIG. 2 is a plan view schematically illustrating a substrate treating apparatus according to an embodiment of the inventive concept.

Referring to FIG. 2, a substrate treating apparatus includes an index module 10, a treatment module 20, and a controller 30. According to an embodiment, when viewed from a top, the index module 10 and the treatment module 20 may be disposed along one direction. Hereinafter, a direction, in which the index module 10 and the treatment module 20 are disposed, will be referred to as a first direction "X", a direction that is perpendicular to the first direction "X" when viewed from the top will be referred to as a second direction "Y", and a direction that is perpendicular to both the first direction "X" and the second direction "Y" will be referred to as a third direction "Z".

The index module 10 transfers a substrate "M" from a container "C", in which the substrate "M" is received, to the treatment module 20 that treats the substrate "M". The index module 10 receives the substrate "M", on which a specific treatment has been performed in the treatment module 20, in the container "C". A lengthwise direction of the index module 10 may be the second direction "Y". The index module 10 includes a plurality of load ports 12 and an index frame 14.

The container "C", in which the substrate "M" is received, is seated on the load port 12. The load ports 12 are located on an opposite side of the treatment module 20 with respect to the index frame 14. The plurality of load ports 12 may be provided, and the plurality of load ports 12 may be disposed in a row along the second direction "Y". However, the number of the load ports 12 may increase or decrease according to a condition, such as the process efficiency of the treatment module 20 or a footprint.

The container "C" may be a closed container such as a front open unified pod (FOUP). The container "C" may be positioned on the load port 12 by a feeding unit (not illustrated) such as an overhead transfer, an overhead conveyor, or an automatic guided vehicle, or an operator.

An index rail 124 and an index robot 120 may be provided in the index frame 14. The index robot 120 transfers the substrate "M". The index robot 120 may transfer the substrate "M" between the index module 10, and a buffer unit 200 that will be described below. The index robot 120 includes an index hand 122, on which the substrate "M" is positioned. The substrate "M" may be positioned on the index hand 122. The hand 122 may be configured to be moved forwards, moved rearwards, rotated about the third direction "Z", and moved along the third direction "Z". A plurality of hands 122 may be provided to be spaced apart from each other in an upward/downward direction. The plurality of hands 122 may be moved forwards and rearwards independently.

A lengthwise direction of the index rail 124 is provided along the second direction "Y" in the index frame 14. The index robot 120 may be positioned on the index rail 124, and the index robot 120 may be provided to be movable on the index rail 124.

The controller 30 may control the substrate treating apparatus. The controller 30 may include a process controller including a microprocessor (computer) that executes control of the substrate treating apparatus, a user interface including a keyboard for inputting commands to allow an operator to manage the substrate treating apparatus and a display that visualizes and displays an operation situation of the substrate treating apparatus, and a memory unit for storing a control program for executing processing executed by the substrate treating apparatus under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

The controller 30 may control the substrate treating apparatus such that the substrate treating apparatus performs a substrate treating method that will be described below. For example, the controller 30 may control configurations provided to a liquid treatment chamber 400 to perform the substrate treating method that will be described below.

The treatment module 20 may include the buffer unit 200, a transfer chamber 300, and the liquid treatment chamber 400. The buffer unit 200 provides a space, in which the substrate "M" carried into the treatment module 20 and the substrate "M" carried out from the treatment module 20 temporarily stay. The transfer chamber 300 provides a space, in which the substrate "M" is transferred between the buffer unit 200 and the liquid treatment chamber 400. The liquid treatment chamber 400 performs a liquid treatment process of liquid-treating the substrate "M" by supplying a liquid onto the substrate "M".

The buffer unit 200 is disposed between the index frame 14 and the transfer chamber 300. The buffer unit 200 may be located at one end of the transfer chamber 300. A plurality of slots (not illustrated), in which the substrates "M" are positioned, are provided in an interior of the buffer unit 200.

A plurality of slots (not illustrated) may be provided to be spaced apart from each other along the third direction "Z".

A front face and a rear face of the buffer unit 200 may be opened. The front face is a surface that faces the index module 10, and the rear face is a surface that faces the transfer chamber 300. The index robot 120 may approach the buffer unit 200 through the front face, and a transfer robot 320 that will be described below may approach the buffer unit 200 through the rear face.

The transfer chamber 300 is disposed such that a lengthwise direction thereof is the first direction "X". Liquid treatment chambers 400 may be disposed on opposite sides of the transfer chamber 300. The liquid treatment chamber 400 may be disposed on sides of the transfer chamber 300. The transfer chamber 300 and the liquid treatment chambers 400 may be disposed along the second direction "Y".

According to an embodiment, the liquid treatment chambers 400 may be disposed on opposite sides of the transfer chamber 300. On one side of the transfer chamber 300, the liquid treatment chambers 400 may be provided on an array of A by B (A and B are integers that are 1 or more than 1) along the first direction "X" and the third direction "Z".

The transfer chamber 300 may include the transfer robot 320 and a transfer rail 340. The transfer robot 320 transfers the substrate "M". The transfer robot 320 transfers the substrate "M" between the buffer unit 200 and the liquid treatment chamber 400. The transfer robot 320 includes a transfer hand 322, on which the substrate "M" is positioned. The substrate "M" may be positioned on the transfer hand 322. The transfer hand 322 may be configured to be moved forwards, moved rearwards, rotated about a third direction "Z", and moved along the third direction "Z". A plurality of hands 322 may be provided to be spaced apart from each other in the upward/downward direction, and the hands 322 may be moved forwards and rearward independently.

The transfer rail 340 may be provided along the lengthwise direction of the transfer chamber 300 in the transfer chamber 300. As an example, a lengthwise direction of the transfer rail 340 may be provided along the first direction "X". The transfer robot 320 may be positioned on the transfer rail 340, and the transfer robot 320 may be provided to be movable on the transfer rail 340.

Hereinafter, the substrate "M" treated in the liquid treatment chamber 400 will be described below with reference to the drawings.

Figure 3:
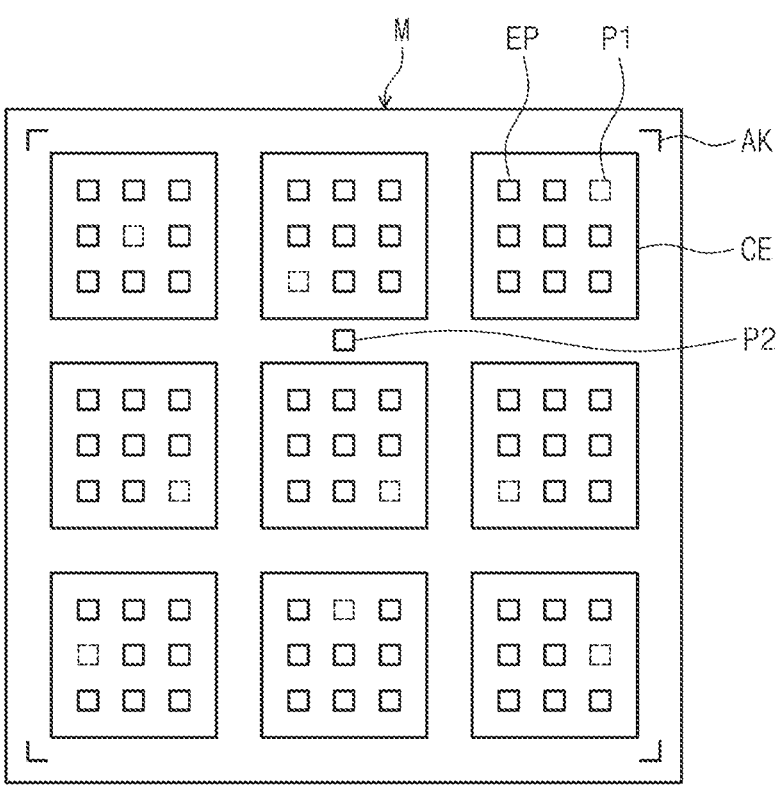
FIG. 3 is a view schematically illustrating an appearance of a substrate treated in a liquid treatment chamber of FIG. 2.

FIG. 3 is a view schematically illustrating an appearance of the substrate treated in the liquid treatment chamber of FIG. 2.

An object that is to be treated in the liquid treatment chamber 400 may be a substrate of any one of a wafer, a glass, and a photo mask. For example, the substrate "M" treated in the liquid treatment chamber 400 may be a photo mask that is a frame used in an exposure process.

The substrate "M" may have a rectangular shape. The substrate "M" may be a photo mask that is a frame used during an exposure process. At least one reference mark AK may be marked on the substrate "M". For example, a plurality of reference marks AK may be formed corner areas of the substrate "M". The reference marks AK may be marks called alignment keys used when the substrate "M" is aligned. Furthermore, the reference marks AK may be marks used to derive location information of the substrate "M". For example, an image module 470 that will be described below may acquire an image by photographing the reference marks AK, and may transmit the acquired image to the controller 30. The controller 30 may detect an accurate location of the substrate "M" by analyzing the image including the reference marks AK. Furthermore, the reference marks AK may be used to recognize a location of the substrate "M" when the substrate "M" is transferred.

Cells CE may be formed on the substrate "M". At least one, for example a plurality of cells CE may be formed. A plurality of patterns may be formed in each of the cells CE. The patterns formed in each of the cells CE may be defined as one pattern group. The patterns formed in the cell CE may include an exposure pattern EP band a first pattern P1.

The exposure pattern EP may be used to form an actual pattern on the substrate "M". The first pattern P1 may be a pattern that represents exposure patterns EP formed in one cell CE. Furthermore, when the plurality of cells CE are provided, a plurality of first patterns P1 may be provided. As an example, the first pattern P1 may be provided to each of the plurality of cells CE. However, the inventive concept is not limited thereto, and the plurality of first patterns P1 may be formed in the one cell CE. The first pattern P1 may have a shape, in which some of the exposure patterns EP are combined. The first pattern P1 may be called a monitoring pattern. An average value of line widths of the plurality of first patterns P1 may be called a critical dimension monitoring macro.

When an operator inspects the first pattern P1 through a scanning electronic microscope (SEM), qualities of shapes of the exposure patterns EP formed in one cell CE may be estimated. Accordingly, the first pattern P1 may be an inspection pattern. Furthermore, unlike the above-described example, the first pattern P1 may be any one of the exposure patterns EP that participate in an actual exposure process. Furthermore, the first pattern P1 may be not only an inspection pattern but also an exposure pattern that participates in an actual exposure.

A second pattern P2 may be a pattern that represents exposure patterns EP formed in the entire substrate "M". For example, the second pattern P2 may have a shape, in which some of the first patterns P1 are combined.

When an operator inspects the second pattern P2 through a scanning electronic microscope (SEM), qualities of shapes of the exposure patterns EP formed in one substrate "M" may be estimated. Accordingly, the second pattern P2 may be an inspection pattern. Furthermore, the second pattern P2 may be an inspection pattern that does not participate in an actual exposure process. The second pattern P2 may be a pattern that sets a process condition of an exposure device. The second pattern P2 may be called an anchor pattern.

Hereinafter, the substrate treating apparatus provided to the liquid treatment chamber 400 will be described below with reference to the drawings. Furthermore, hereinafter, performance of a fine critical dimension correction process of a process of manufacturing a mask for an exposure process, in a treatment process performed in the liquid treatment chamber 400, will be described as an example.

The substrate "M" carried into the liquid treatment chamber 400 to be treated may be the substrate "M", on which a pre-treatment has been performed. Line widths of the first pattern P1 and the second pattern P2 of the substrate "M" carried into the liquid treatment chamber 400 may be different. For example, a line width of the first pattern P1 may be a first width, and a line width of the second pattern P2 may be a second width. The first width that is the line width of the first pattern P1 may be larger than the second width that is the line width of the second pattern P2. For example, the first width may be 69 nm and the second width may be 68.5 nm.

Figure 4:
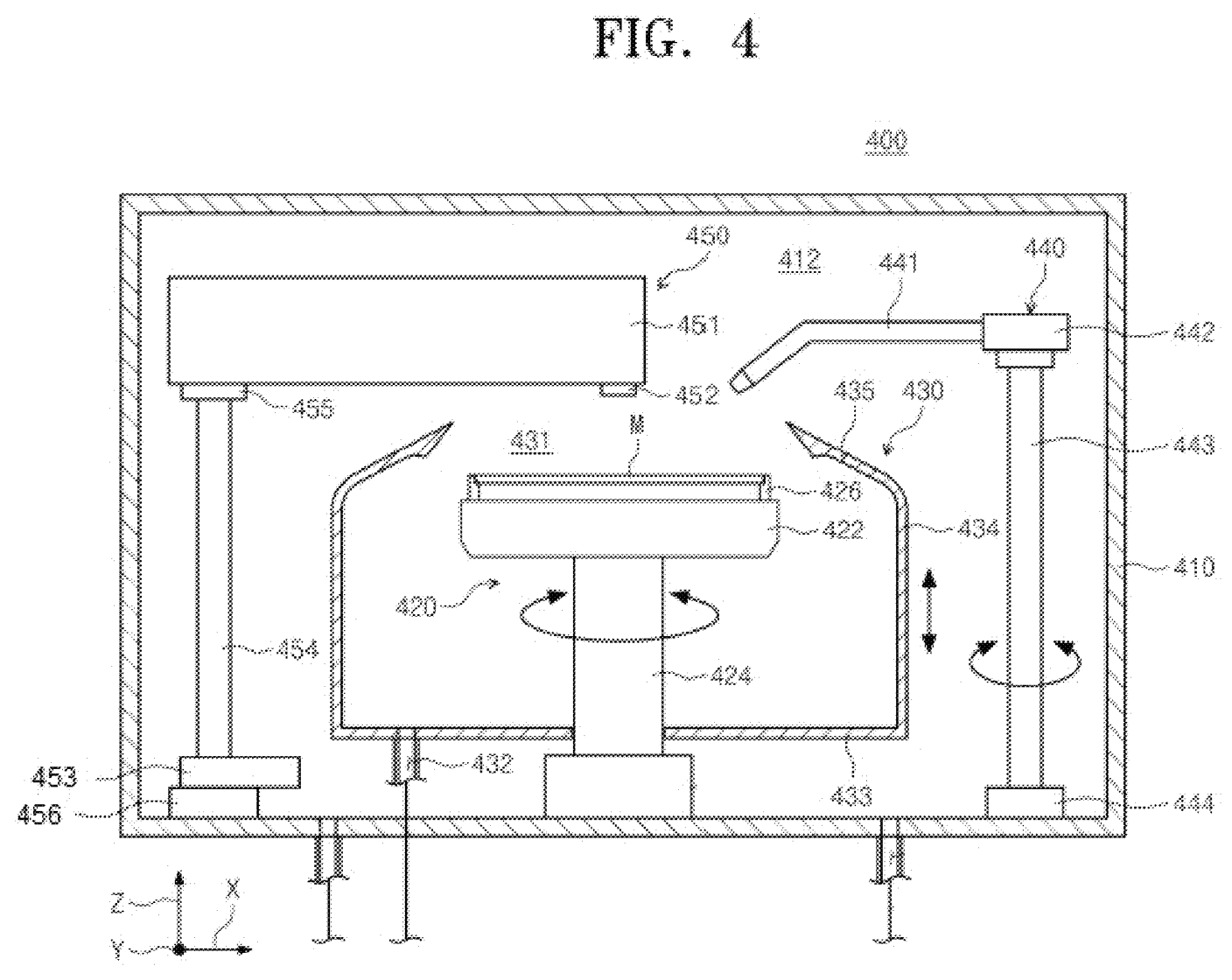
Figure 5:
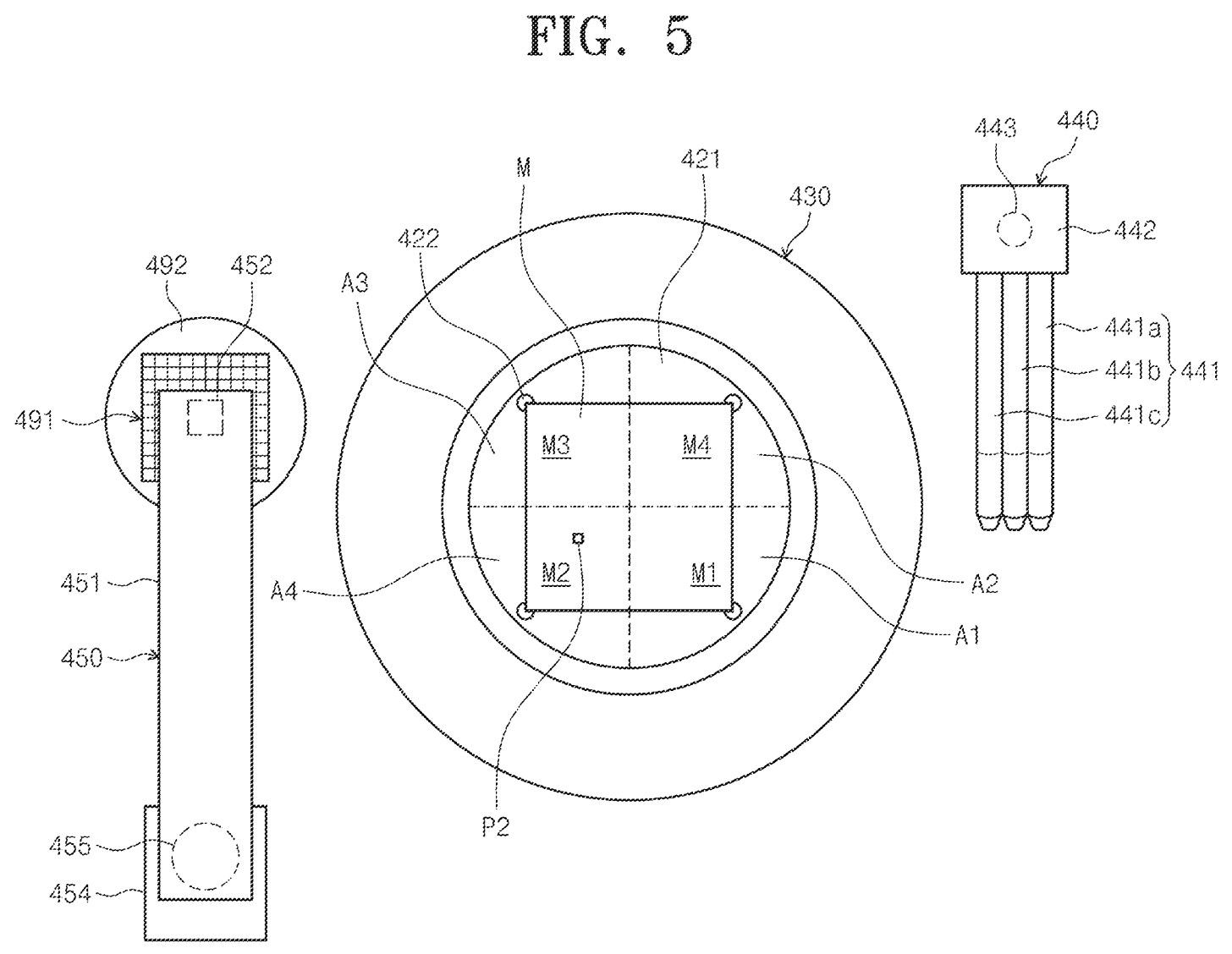

FIG. 4 is a view schematically illustrating an embodiment of the liquid treatment chamber of FIG. 2. FIG. 5 is a view of the liquid treatment chamber of FIG. 4, when viewed from the top.

Referring to FIGS. 4 and 5, the liquid treatment chamber 400 may include a housing 410, a support unit 420, a treatment container 430, a liquid supply unit 440, and a heating unit 450.

The housing 410 has an interior space. The housing 410 may have an interior space, into which the treatment container 430 is provided. The housing 410 may have the interior space, into which the liquid supply unit 440 and the heating unit 450 are provided. A carrying in/out hole (not illustrated), through which the substrate "M" may be carried in and out, may be formed in the housing 410. A material that is highly resistant to chemicals supplied by the liquid supply unit 440 may be coated on an inner wall surface of the housing 410.

An exhaust hole (not illustrated) may be formed on a bottom surface of the housing 410. The exhaust hole (not illustrated) may be connected to an exhaust member, such as a pump, which may exhaust the interior space. Accordingly, fumes that may be generated in the interior space may be exhausted to an outside of the housing 410 through the exhaust hole (not illustrated).

The support unit 420 may support the substrate "M" in the treatment space of the treatment container 430 that will be described below. The support unit 420 may support the substrate "M". The support unit 420 may rotate the substrate "M". The support unit 420 may include a chuck 421, a support pin 422, a support shaft 426, and a driving member 427.

The chuck 421 may have a plate shape having a specific thickness. The chuck 421 has an upper surface having a substantially circular shape when viewed from the top. The upper surface of the chuck 421 may have an area that is larger than that of the substrate "M". The support pin 422 may be installed in the chuck 421. The chuck 421 may be a spin chuck. The chuck 421 may be coupled to the support shaft 426, which will be described below, to be rotated. As the chuck 421 is rotated, the substrate "M" seated on the chuck 421 also may be rotated.

The support pin 422 may support the substrate "M". The support pin 422 may have a substantially circular shape when viewed from the top. The support pin 422 may have a shape in which a portion corresponding to a corner area of the substrate "M" is recessed downwards when viewed from the top. The support pin 422 may have a first surface and a second surface. As an example, the first surface may support a lower side of a corner area of the substrate "M". The second surface may face a side of a corner area of the substrate "M" such that movement of the substrate in a lateral direction is restricted when the substrate "M" is rotated. At least one support pin 422 may be provided. For example, a plurality of support pins 422 may be provided. The number of support pins 422 may correspond to the number of the corner areas of the substrate "M" having a rectangular shape. The support pins 422 may space a lower surface of the substrate "M" and an upper surface of the chuck 421 apart from each other by supporting the substrate "M".

The support shaft 426 may be coupled to the chuck 421. The support shaft 426 may be located on a lower side of the chuck 421. The support shaft 426 may be a hollow shaft. The support shaft 426 may be rotated by the driving member 427. For example, the driving member 427 may be a hollow motor. When the driving member 427 rotates the support shaft 426, the chuck 421 coupled to the support shaft 426 may be rotated. The substrate "M" positioned on the support pin 422 installed in the chuck 421 may be rotated when the chuck 421 is rotated.

The treatment container 430 may have a vessel shape, an upper side of which is opened. The treatment container 430 may have a treatment space 431, and the substrate "M" may be liquid-treated and heated in the treatment space 431. The treatment container 430 may prevent the treatment liquid supplied to the substrate "M" from spattering and being delivered to the housing 410, the liquid supply unit 440, and the heating unit 450.

The treatment container 430 may include a bottom part 433, a vertical part 434, and an inclined part 435. The bottom part 433 may have an opening, into which the support shaft 424 may be inserted, when viewed from the top. The vertical part 434 may extend from the bottom part 433 along the third direction "Z". The inclined part 435 may extend to be inclined from the vertical part 434 upwards. For example, the inclined part 435 may extend to be inclined in a direction that faces the substrate "M" supported by the support unit 420. A discharge hole 432, through which the treatment liquid supplied by the liquid supply unit 440 may be discharged to the outside, may be formed in the bottom part 433. Furthermore, the treatment container 430 may be coupled to an elevation member (not illustrated) such that a location thereof is changed along the third direction "Z". The elevation member (not illustrated) may be a driving device that moves the treatment container 430 in the upward/downward direction. The elevation member (not illustrated) may move the treatment container 430 upwards while the substrate "M" is liquid-treated and/or heated, and may move the treatment container 430 downwards when the substrate "M" is carried into an interior space 412 or the substrate "M" is carried out of the interior space 412.

The liquid supply unit 440 may supply the liquid onto the substrate "M". The liquid supply unit 440 may supply the treatment liquid for liquid-treating the substrate "M". The liquid supply unit 440 may supply the treatment liquid to the substrate "M" supported by the support unit 420. As an example, the liquid supply unit 440 may supply the treatment liquid to the mask "M", in which the first pattern P1 formed in the plurality of cells CE and the second pattern P2 on an outer side of the area, in which the cells CE are formed, are formed.

The treatment liquid may be an etching liquid and a rinsing liquid. The etching liquid may be a chemical. The etching liquid may etch the patterns formed on the substrate "M". The etching liquid also may be called etchant. The etchant may be a liquid including a mixture liquid, in which ammonia, water, and an additive are mixed, and hydrogen peroxide. The rinsing liquid may clean the substrate "M". The rinsing liquid may be a known chemical.

The liquid supply unit 440 may include a nozzle 441, a fixed body 442, a rotary shaft 443, and a rotary member 444. The nozzle 441 may supply the treatment liquid to the substrate "M" supported by the support unit 420. One end of the nozzle 441 may be connected to the fixed body 442, and an opposite end thereof may extend in a direction that faces the substrate "M" from the fixed body 442. The nozzle 441 may extend from the fixed body 442 along the first direction "X". The opposite end of the nozzle 441 may be bent at a specific angle in a direction that faces the substrate "M" supported by the support unit 420 to extend.

The nozzle 441 may include a first nozzle 441*a*, a second nozzle 441*b*, and a third nozzle 441*c*. Any one of the first nozzle 441*a*, the second nozzle 441*b*, and the third nozzle

441*c* may supply, among in the above-described treatment liquid, the chemical. Furthermore, another one of the first nozzle 441*a*, the second nozzle 441*b*, and the third nozzle 441*c* may supply, among the above-described treatment liquids, the rinsing liquid. Still another one of the first nozzle 441*a*, the second nozzle 441*b*, and the third nozzle 441*c* may supply a different kind of chemical from the chemical supplied by the any one of the first nozzle 441*a*, the second nozzle 441*b*, and the third nozzle 441*c*.

The body 442 may fix and support the nozzle 441. The body 442 may be connected to the rotary shaft 443 that is rotated about the third direction "Z" by the rotary member 444. When the rotary member 444 rotates the rotary shaft 443, the body 442 may be rotated about the third direction "Z". Accordingly, a discharge hole of the nozzle 441 may be moved between a liquid supply location that is a location, at which the treatment liquid is supplied to the substrate "M", and a standby location that is a location, at which the treatment liquid is not supplied to the substrate "M".

The heating unit 450 may heat the substrate "M". The heating unit 450 may heat a partial area of the substrate "M". The heating unit 450 may heat a specific area of the substrate "M". The heating unit 450 may heat the substrate "M", to which the chemical is supplied such that a liquid film is formed. The heating unit 450 may heat the patterns formed on the substrate "M". The heating unit 450 may heat some of the patterns formed on the substrate "M". The heating unit 450 may heat any one of the first pattern P1 and the second pattern P2. For example, the heating unit 450 may heat, among the first pattern P1 and the second pattern P2, the second pattern P2. In an embodiment, the heating unit 450 may heat the second pattern P2 by irradiating the laser light "L" to the second pattern P2.

Figure 6:
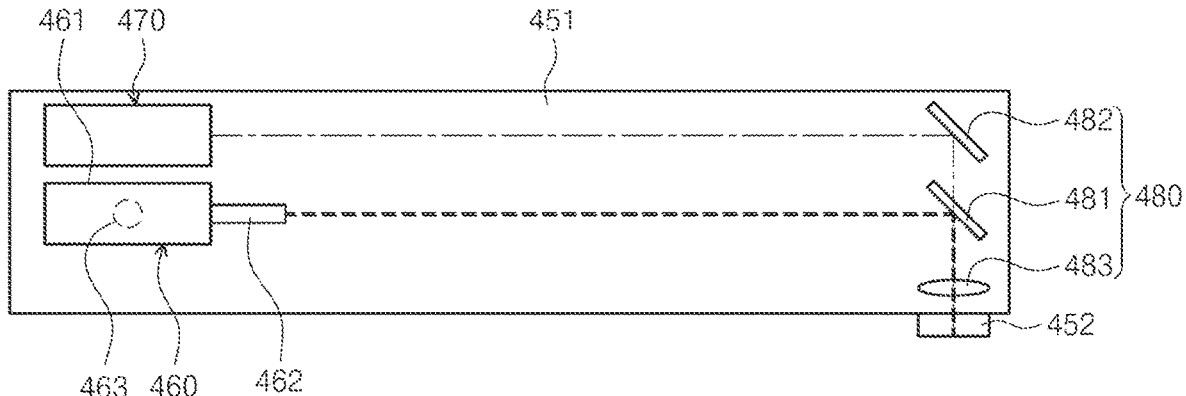
FIG. 6 is a view illustrating appearances of a body of a heating unit of FIG. 4, a laser irradiating module, and a camera module.

FIG. 6 is a view illustrating appearances of the body of the heating unit of FIG. 4, a laser irradiating module, and a camera module. Referring to FIG. 6, the heating unit 450 may include a body 451, the movement module, a laser irradiating module 460, and the camera module. The camera module may include the image module 470 and an optical module 480.

The body 451 may be a container having an installation space in an interior thereof. The laser module 460, the image module 470, and the optical module 480, which will be described below, may be installed in the body 451. The body 451 may include a laser irradiator 452. The laser light "L" irradiated by the laser module 460 that will be described below may be irradiated to the substrate "M" through the laser irradiator 452. Furthermore, the light irradiated by a lighting member 472 that will be described below may be provided through the laser irradiator 452. Furthermore, an image of an image acquiring member 471 that will be described below may be captured through the laser irradiator 452.

The movement module may be coupled to the heating unit 450. The movement module may move the heating unit 450. The movement module may move the heating unit 450 between a heating location, at which the laser light "L" is irradiated to the substrate "M" and a standby location that deviates from the substrate "M". The standby location may be a location, at which the laser light "L" is not irradiated to the substrate "M" by the heating unit 450. The movement module may change the location of the laser irradiator 452 of the heating unit 450 by moving the heating unit 450. The movement module may move the laser irradiator 452 of the heating unit 450 between a standby location that is a location, at which the laser irradiator 452 does not perform a process, and a heating location that is a location, at which the laser irradiator 452 irradiates the laser light "L" onto the substrate "M". When the heating unit 450 is moved to the heating location by the movement module, the laser irradiator 452 may be located at a location that overlaps the heating location vertically. When the heating unit 450 is moved to the standby location by the movement module, the laser irradiator 452 may be located on an upper side of a monitoring target 491 that will be described below. The movement module may move the heating unit 450 at a specific angle. Furthermore, the movement module may linearly move the heating unit 450 in a first direction (the X axis direction) and a second direction (the Y axis direction).

Referring to FIGS. 4 and 5, the movement module may include perpendicular movement parts 453 and 454 and a rotation part 455. The perpendicular movement parts 453 and 454 may include the first driver 453 and the second driver 454. The first driver 453 may linearly move the heating unit 450 in the first direction. The second driver 454 may linearly move the heating unit 450 in in the second direction that is perpendicular to the first direction. The first driver 453 and the second driver 454 may be motors. As an example, the first driver 453 and the second driver 454 may be linear motors. As an example, the perpendicular movement parts 453 and 454 may be manual stages. However, the inventive concept is not limited thereto, and the perpendicular movement parts 453 and 454 may be known devices that provide driving power.

The second driver 454 may be coupled onto the first driver 453. The perpendicular movement parts 453 and 454 may be coupled to the body 451 of the heating unit 450 by a shaft 456 that will be described below. The perpendicular movement parts 453 and 454 may be spaced apart from the rotation part 455 in an axial direction of the shaft 456. Furthermore, the perpendicular movement parts 453 and 454 may overlap the rotation part 455 in the axial direction of the shaft 456. The perpendicular movement parts 453 and 454 may be provided at locations that are lower than the rotation part 455.

The first driver 453 may move the laser irradiator 452 in the first direction by a first movement distance. That is, a maximum stroke distance of the first driver 453 may be the first movement distance. The first movement distance may correspond to a length of any one of division surfaces obtained by equally dividing the substrate "M" into four parts, in the first direction. That is, the substrate "M" includes first to fourth quadrants M1 to M4, the first movement distance may correspond to a length of any one of the first to fourth quadrants M1 to M4 in the first direction. The first driver 453 may move the laser irradiator 452 in the first direction within a first movement distance.

The second driver 454 may move the laser irradiator 452 in the second direction by a second movement distance. That is, a maximum stroke distance of the second driver 454 may be the second movement distance. The second movement distance may correspond to a length of any one of division surfaces obtained by equally dividing the substrate "M" into four parts, in the second direction. That is, the substrate "M" includes first to fourth quadrants M1 to M4, the second movement distance may correspond to a length of any one of the first to fourth quadrants M1 to M4 in the second direction. The second driver 454 may move the laser irradiator 452 in the second direction within a second movement distance.

The rotation part 455 may rotate the heating unit 450 at a specific angle. The rotation part 455 may swing the heating unit 450 at a specific angle. The rotation part 455 may be a motor. The rotation part 455 may be a known device that may provide driving power. The rotation part 455 may rotate the heating unit 450 about the shaft 456 that will be described below. Accordingly, the laser irradiator 452 may be rotated. An imaginary line obtained by connecting paths, along which the laser irradiator 452 is moved, may have an arc shape. The rotation part 455 may rotate the heating unit 450 about the shaft 456 in one direction and/or an opposite direction that is opposite to the one direction.

The rotation part 455 may be coupled to a bottom surface of the body 451 of the heating unit 450. The laser irradiator 452 may be coupled to one end of the bottom surface of the body 451 of the heating unit 450, and the rotation part 455 may be coupled to an opposite end of the bottom surface of the body 451 of the heating unit 450. Accordingly, when the heating unit 450 is rotated about the shaft 456, the laser irradiator 452 may be rotated.

Referring to FIGS. 4 and 5, the movement module may include the shaft 456. The shaft 456 may be disposed between the perpendicular movement parts 453 and 454 and the rotation part 455. One end of the shaft 456 may be coupled to the perpendicular movement part 453, and an opposite end of the shaft 456 may be coupled to the rotation part 455. The shaft 456 may be moved in the first direction together with the heating unit 450 when the heating unit 450 is moved in the first direction by the first driver 453. Accordingly, the heating unit 450 coupled to the shaft 456 may be moved in the first direction, and the laser irradiator 452 of the heating unit 450 also may be moved in the first direction. The shaft 456 may be moved in the second direction together with the heating unit 450 when the heating unit 450 is moved in the second direction by the second driver 454. Accordingly, the heating unit 450 coupled to the shaft 456 may be moved in the second direction, and the laser irradiator 452 of the heating unit 450 also may be moved in the second direction. The shaft 456 may not be rotated when the heating unit 450 is rotated by the rotation part 455. That is, the rotation part 455 may not rotate the shaft 456 but rotate only the body 451 of the heating unit 450. However, the inventive concept is not limited thereto, and the rotation part 455 rotates the shaft 456 and the body 451 may be rotated through rotation of the shaft 456.

Figure 7:
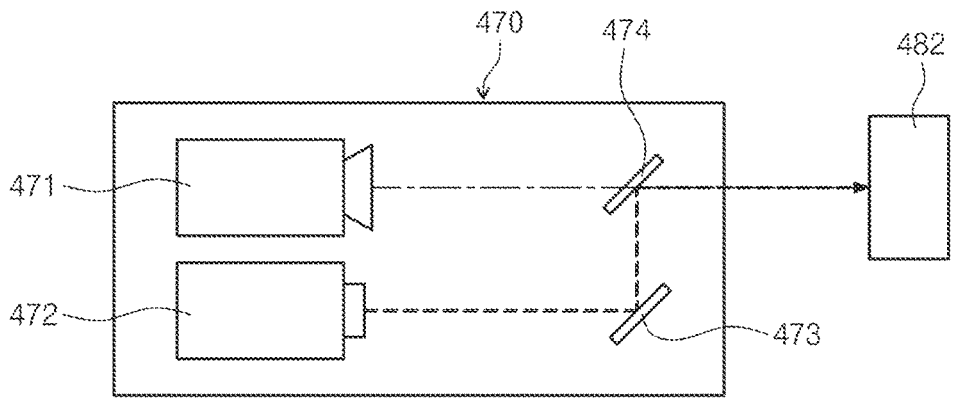
FIG. 7 is a view of an image module of FIG. 6, when viewed from the top.

FIG. 6 is a view illustrating appearances of the body of the heating unit of FIG. 4, the laser irradiating module, and the camera module. FIG. 7 is a view of the image module of FIG. 6, when viewed from the top. Referring to FIGS. 6 and 7, the laser irradiating module 460 may be installed in the body 451. The camera module may be installed in the body 451.

The laser module 460 may include a laser irradiating part 461, a beam expander 462, and a tilting member 463. The laser irradiating part 461 may irradiate the laser light "L". The laser irradiating part 461 may irradiate the laser light "L" having a straightness. A shape/profile of the laser light "L" irradiated by the laser irradiating part 461 may be adjusted by the beam expander 462. For example, a diameter of the laser light "L" irradiated by the laser irradiating part 461 may be changed by the beam expander 462. The diameter of the laser light "L" irradiated by the laser irradiating part 461 may be increased or decreased by the beam expander 462.

The tilting member 463 may tilt an irradiation direction of the laser light "L" irradiated by the laser irradiating part 461. For example, the tilting member 463 may tilt the irradiation direction of the laser light "L" irradiated by the laser irradiating part 461 by rotating the laser irradiating part 461 about one axis. The tilting member 463 may include a motor.

The camera module may include the image module 470 and the optical module 480. The image module 470 may monitor the laser light "L" irradiated by the laser irradiating part 461. The image module 470 may include the image acquiring member 471, the lighting member 472, a first reflection plate 473, and a second reflection plate 474. The image acquiring member 471 may acquire an image for the substrate "M" and/or the monitoring target 491 of an error identifying unit 490, which will be described below. The image acquiring member 471 may be a camera. The image acquiring member 471 may be a vision device. The image acquiring member 471 may acquire an image including a point, to which the laser light "L" irradiated by the laser irradiating part 461 is irradiated. The image module 470 may transmit an image acquired by the image acquiring member 471 to the controller 30. The image module 470 may acquire an image displayed on the monitoring target 491, which will be described below, of the laser light "L" irradiated by the laser irradiator 452, and may transmit the acquired image to the controller 30.

The lighting member 472 may provide light such that the image may be easily acquired by the image acquiring member 471. The light provided by the lighting member 472 may be reflected sequentially along the first reflection plate 473 and the second reflection plate 474.

The optical module 480 may be configured such that an irradiation direction of the laser light "L" irradiated by the laser irradiating part 461, a photographing direction, in which the image acquiring member 471 acquires the image, and an irradiation direction of the light provided by the lighting member 472 may be on the same axis when viewed from the top. The lighting member 472 may deliver the light to an area, in which the laser light "L" is irradiated by the optical module 480. Furthermore, the image acquiring member 471 may acquire an image, such as an image/picture for an area, to which the laser light "L" is irradiated, in real time. The optical module 480 may include a first reflection member 481, a second reflection member 482, and a lens 483.

The first reflection member 481 may change the irradiation direction of the laser light "L" irradiated by the laser irradiating part 461. For example, the first reflection member 481 may change the irradiation direction of the laser light "L" irradiated horizontally to a downward direction. Furthermore, the laser light "L" refracted by the first reflection member 481 may sequentially pass through the lens 483 and the laser irradiator 452 and may be delivered to the substrate "M" that is to be treated or the monitoring target 491 that will be described below.

The second reflection member 482 may change the photographing direction of the image acquiring member 471. For example, the second reflection member 482 may change the photographing direction of the image acquiring member 471, which is a horizontal direction, to a vertically downward direction. Furthermore, the second reflection member 482 may change the irradiation direction of the light of the lighting member 472, which is delivered sequentially via the first reflection plate 473 and the second reflection plate 474 from the horizontal direction to a vertically downward direction.

Furthermore, the first reflection member 481 and the second reflection member 482 may be provided at the same location when viewed from the top. Furthermore, the second reflection member 482 may be disposed on an upper side of the first reflection member 481. Furthermore, the first reflection member 481 and the second reflection member 482 may be tilted at the same angle.

Figure 8:
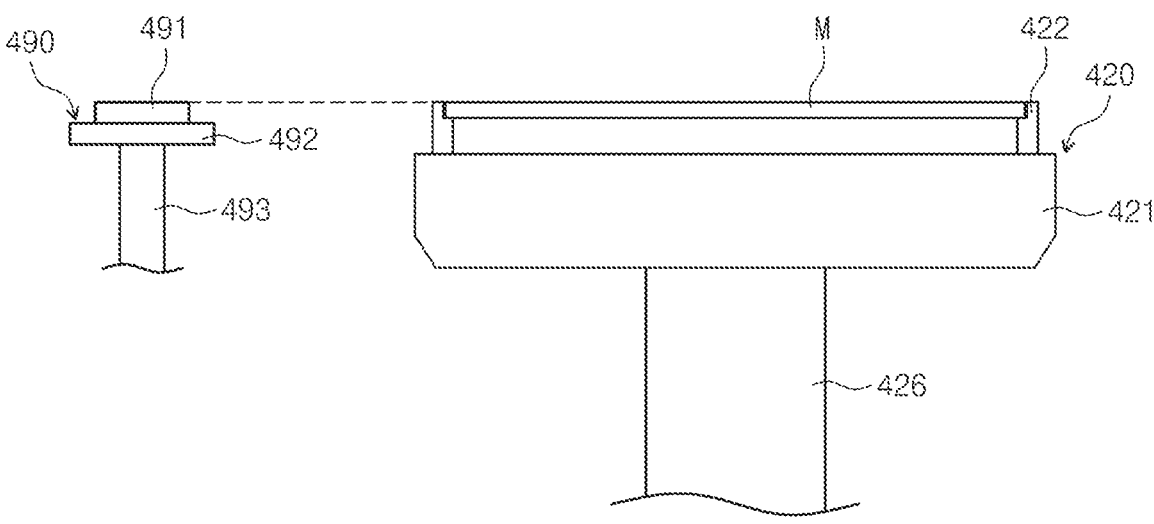
FIG. 8 is a view illustrating an error identifying unit and the support unit of the liquid treatment chamber of FIG. 4.
Figure 9:
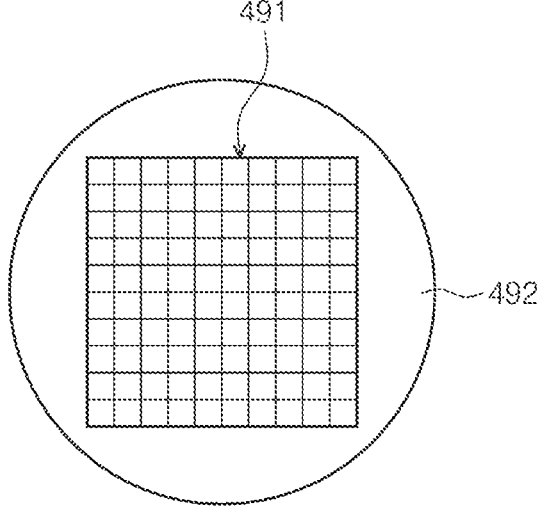
FIG. 9 is a view of an error identifying unit of FIG. 8, when viewed from the top.

FIG. 8 is a view illustrating the error identifying unit and the support unit of the liquid treatment chamber of FIG. 4. FIG. 9 is a view of the error identifying unit of FIG. 8, when viewed from the top. Referring to FIGS. 8 and 9, the error identifying unit 490 may identify whether an error is generated between an irradiation location of the laser light "L" and a preset target location TP. For example, the error identifying unit 490 may be provided in an interior of the housing 410. Furthermore, the error identifying unit 490 may be installed in an area on a lower side of the laser irradiator 452 when the laser irradiator 452 is located at the above-described standby location. The error identifying unit 490 may include the monitoring target 491, a plate 492, and a support frame 493. The plate 492 and the support frame 493 may be provided to a standby port that provides a space, in which the laser irradiator 452 stands by. The standby port is located at a standby location, at which the laser irradiator 452 stands by. Accordingly, the plate 492 and the support frame 493 may be located at the standby location when viewed from the top.

The monitoring target 491 also may be called a global coordinate. The preset target location TP may be marked on the monitoring target 491. Furthermore, the monitoring target 491 may include scales to identify an error between the target location TP and the irradiation location, at which the laser "L" is irradiated. The monitoring target 491 may have an origin point that coincides with a center of the laser irradiator 452 located on an upper side of the standby port. The monitoring target 491 may have an origin point that coincides with a center of the light irradiated by the laser irradiator 452 located on the upper side of the standby port.

The monitoring target 491 may be installed on the plate 492. The plate 492 may be supported by the support frame 493. A height of the monitoring target 491, which is determined by the plate 492 and the support frame 493, may be the same as that of the substrate "M" supported by the support unit 420. For example, a height from a bottom surface of the housing 410 to an upper surface of the monitoring target 491 may be the same as a height from the bottom surface of the housing 410 to an upper surface of the substrate "M" supported by the support unit 420. This is for causing the height of the laser irradiator 452 when an error is identified by using the error identifying unit 490 and the height of the laser irradiator 452 when the substrate "M" is heated to coincide with each other.

When the irradiation direction of the laser light "L" irradiated by the laser irradiating part 461 is distorted with respect to the third direction "Z" even by a small degree, the irradiation location of the laser light "L" may be changed according to the height of the laser irradiator 452, and thus, the monitoring target 491 may be provided at the same height as that of the substrate "M" supported by the support unit 420.

Hereinafter, a method for treating a substrate according to an embodiment of the inventive concept will be described in detail. The method for treating the substrate, which will be described below, may be performed by the above-described liquid treatment chamber 400. Furthermore, the above-described controller 30 may control configurations of the liquid treatment chamber 400 such that the method for treating the substrate, which will be described below, is performed by the liquid treatment chamber 400. For example, the controller 30 may generate a control signal that controls at least any one of the support unit 420, an elevation member 436, the liquid supply unit 440, and the heating unit 450 such that the configurations of the liquid treatment chamber 400 performs the substrate treating method that will be described below.

Figure 10:
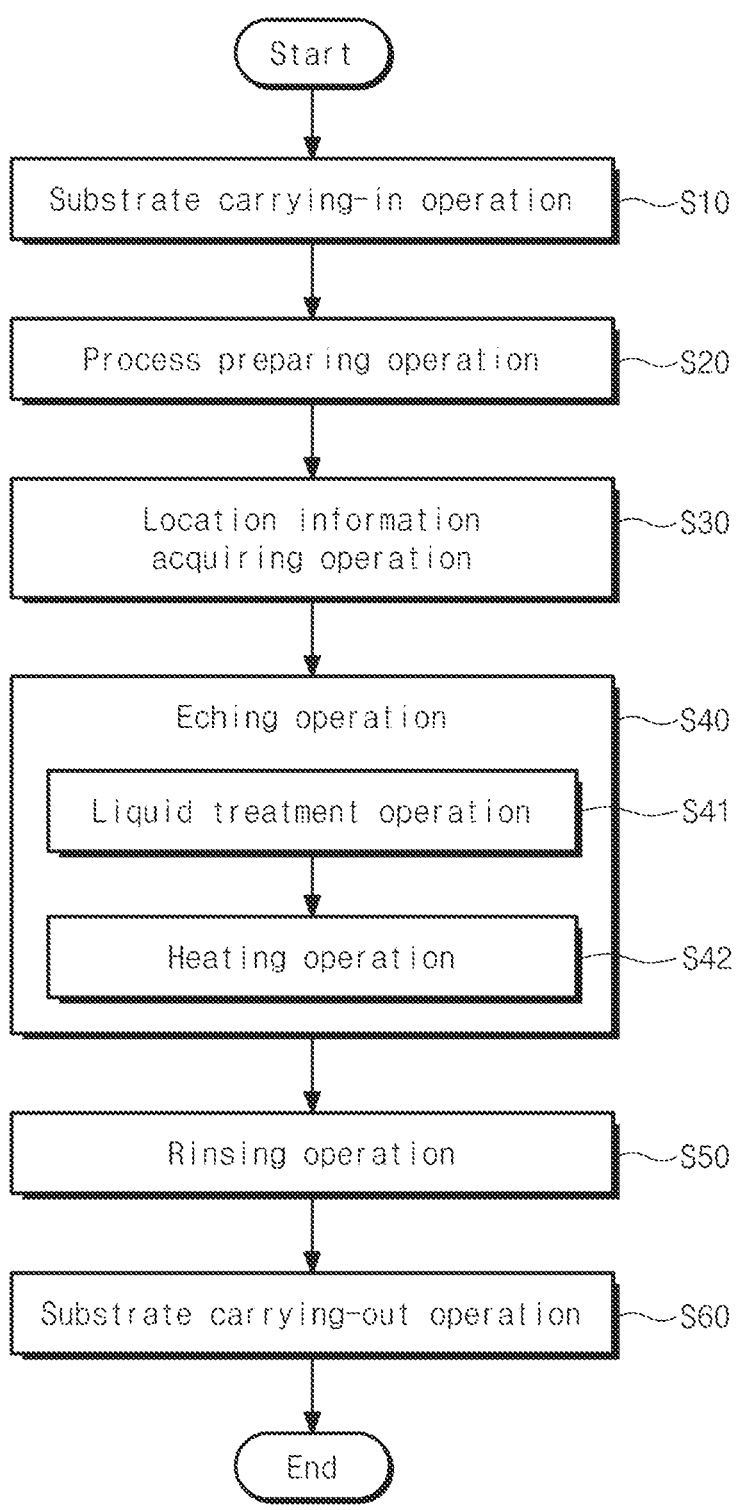
FIG. 10 is a flowchart illustrating a substrate treating method according to an embodiment of the inventive concept.

FIG. 10 is a flowchart illustrating the substrate treating method according to an embodiment of the inventive concept. Referring to FIG. 10, the substrate treating method according to an embodiment of the inventive concept may include a substrate carrying-in operation S10, a process preparing operation S20, a location correcting operation S30, an etching operation S40, a rinsing operation S50, and a substrate carrying-out operation S60.

In the substrate carrying-in operation S10, a door may open a carrying-in/out hole formed in the housing 410. Furthermore, in the substrate carrying-in operation S10, the transfer robot 320 may seat the substrate "M" on the support unit 420. While the transfer robot 320 seats the substrate "M" on the support unit 420, the elevation member 436 may lower a location of the treatment container 430.

Figure 11:
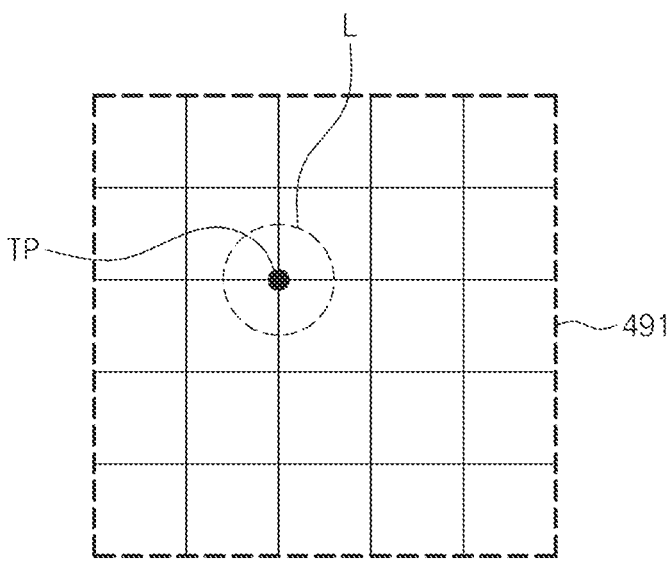
FIG. 11 is a view illustrating an appearance of identifying an error between an irradiation location of laser light and a preset target location, by the substrate treating apparatus in a process preparing operation of FIG. 10.

FIG. 11 is a view illustrating an appearance of identifying an error between an irradiation location of laser light and a preset target location, by the substrate treating apparatus in the process preparing operation of FIG. 10. Referring to FIG. 11, the process preparing operation S20 may be performed after the substrate "M" has been carried in. In the process preparing operation S20, it may be identified whether the substrate "M" is accurately seated on the support pin 422. In the process preparing operation S20, the location of the substrate "M" may be identified. In the process preparing operation S20, it may be identified whether there is an error in the irradiation location of the laser light "L" irradiated to the substrate "M". For example, in the process preparing operation S20, the laser irradiating module 470 may irradiate laser light "L" for a test to the monitoring target 491 of the error identifying unit 490.

An image of the laser light "L" displayed on the monitoring target 491 may be acquired by the image acquiring member 471. Location information at the standby location of the laser irradiating module 470 may be derived from the image acquired by the image acquiring member 471. Location information on the laser light "L" irradiated by the laser irradiator 452 may be derived from the acquired image.

As an example, it may be determined that the laser irradiating part 461 is distorted when the laser light "L" irradiated by the laser irradiator 452 is not located at the origin point of the monitoring target 491. When the location of the laser light "L" coincides with the preset target location TP disposed on the monitoring target 491, it may be determined that the laser irradiating part 461 is not distorted, and the location correcting operation S30 may be performed.

Furthermore, based on the location information of the laser light "L" for a test, which is calculated from the acquired image, a total sum of displacements of the laser irradiator 452 from the above-described standby location to a specific pattern located at the heating location, at which the laser light "L" is irradiated, may be calculated. As an example, displacements of the laser irradiator 452 from the standby location to the second pattern P2 located at the heating location, in the first direction "X" and the second direction "Y" may be calculated respectively. When the displacement of the laser irradiator 542 in the first direction "X" or in the second direction "Y" is not the same as a value of a preset displacement, it may be determined that the location of the laser irradiator 542 is distorted.

Furthermore, diameter information on the laser light "L" for a test, which is calculated from the acquired image, may be derived. Based on the derived diameter information of the laser light "L" for a test, information on the laser light "L"

irradiated from the laser irradiator 452 may be acquired. As an example, when the acquired image of the laser light "L" deviates from a diameter range of a preset range, it may be determined that there is an problem in the beam expander 462.

Figure 12:
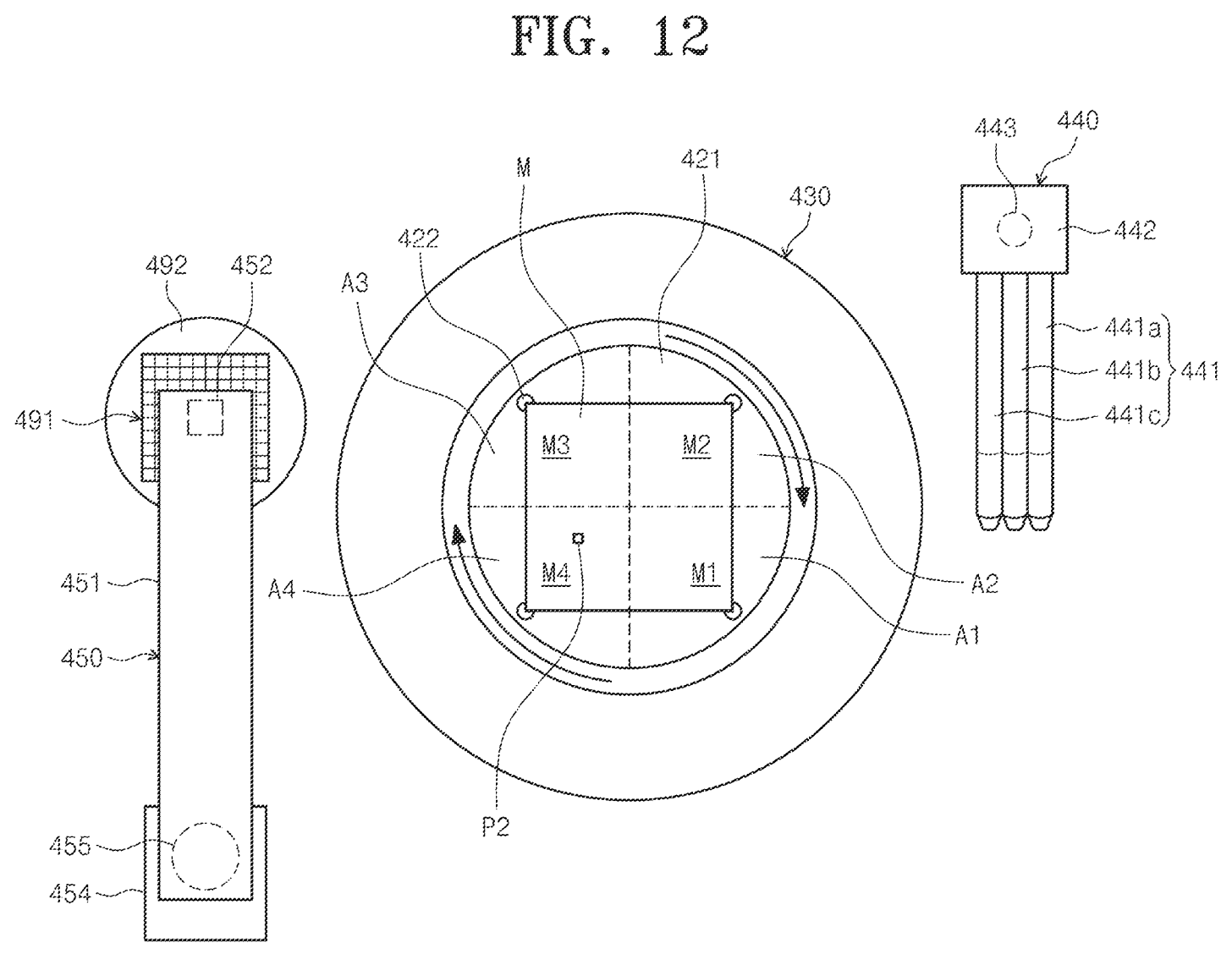
Figure 13:
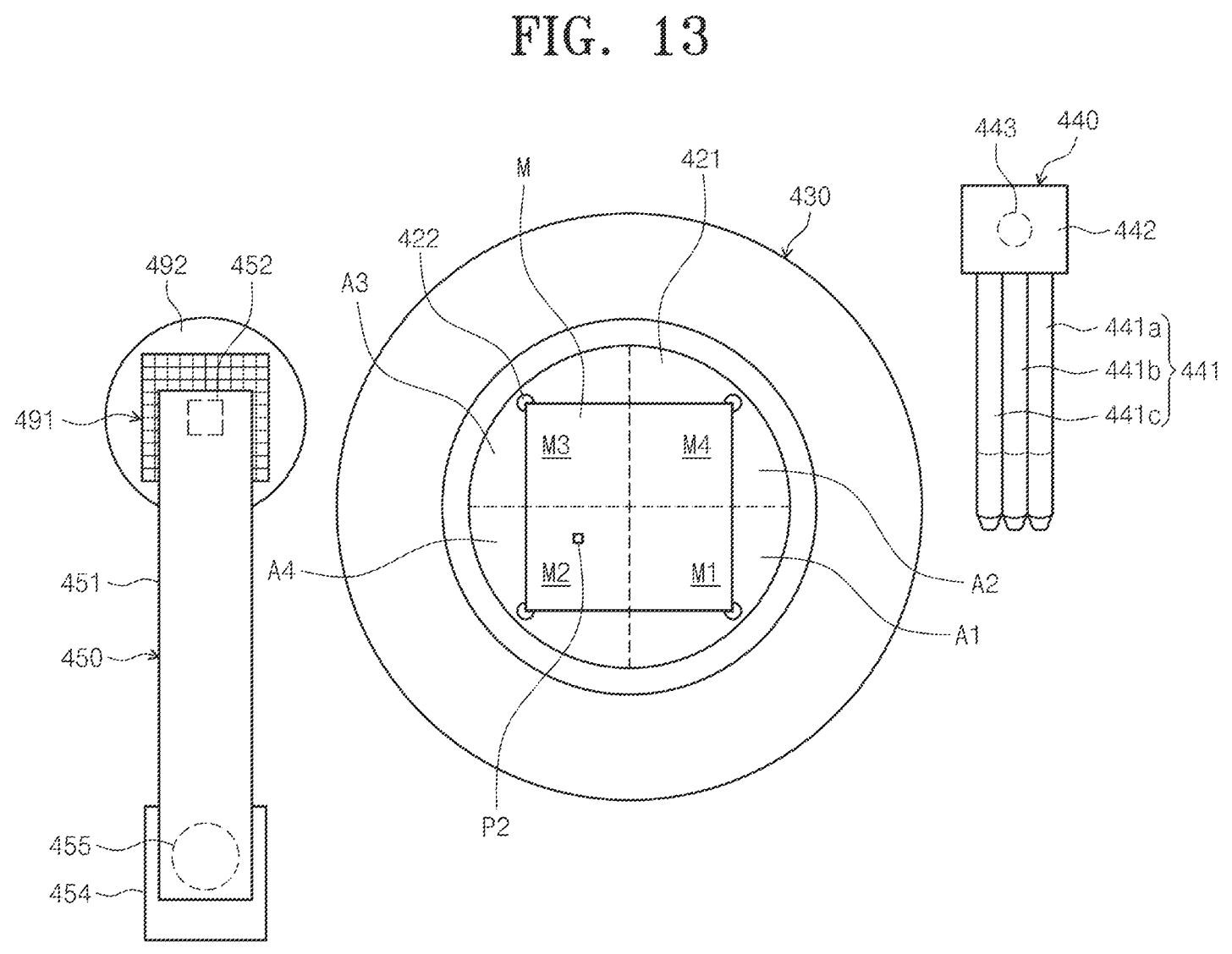

FIGS. 12 and 13 are views illustrating an appearance of the substrate treating apparatus that performs a location correcting operation of FIG. 10. Referring to FIGS. 12 and 13, in the location correcting operation S30, the specific pattern formed on the substrate "M" may be moved to the heating location, at which the laser light "L" is irradiated.

The substrate "M" may include a plurality of division surfaces. As an example, the substrate "M" may be equally divided into four parts. Accordingly, the substrate "M" may include first to fourth quadrants M1, M2, M3, and M4. The pattern on the substrate "M" may be formed in any one of the first to fourth quadrants M1, M2, M3, and M4. As an example, the second pattern P2 irradiated by the laser light "L" may be formed in any one of the first to fourth quadrants M1, M2, M3, and M4. Hereinafter, it will be described that the second pattern P2 is formed in the second quadrant M2.

When the substrate "M" is seated on the support unit 420, an area, in which the first quadrant M1 of the substrate "M" is positioned, may be referred to as a first quadrant area A1. When the substrate "M" is seated on the support unit 420, an area, in which the second quadrant M2 of the substrate "M" is positioned, may be referred to as a second quadrant area A2. When the substrate "M" is seated on the support unit 420, an area, in which the third quadrant M3 of the substrate "M" is positioned, may be referred to as a third quadrant area A3. When the substrate "M" is seated on the support unit 420, an area, in which the fourth quadrant M4 of the substrate "M" is positioned, may be referred to as a fourth quadrant area A4.

The heating location may be a quadrant area, in which any one of the plurality of quadrants of the substrate "M" supported on the support unit 420 is located. The heating location may be a quadrant area, in which a displacement of the laser irradiator 452 is smallest when the laser irradiator 452 is moved from the standby location to the heating location. The heating location may be a quadrant area that is closest to the heating unit 450. Referring to FIG. 12, the heating location may be the fourth quadrant area A4.

Referring to FIG. 13, in the location correcting operation, among the first pattern P1 and the second pattern P2 formed on the substrate "M", the second pattern P2 is moved to the heating location. In the location correcting operation S30, the second quadrant M2, in which the second pattern P2 is formed, is moved to the fourth quadrant area A4 that is the heating location. In the location correcting operation S30, the support unit 420 is rotated such that the second pattern P2 is located in the fourth quadrant area A4. As an example, when the second quadrant M2, in which the second pattern P2 is formed, is located in the second quadrant area A2, the support unit 420 is moved in the clockwise direction and the second quadrant M2, in which the second pattern P2 is formed, is moved to the fourth quadrant area A4. As another example, when the second quadrant M2, in which the second pattern P2 is formed, is located in the third quadrant area A3, the support unit 420 is moved in the counterclockwise direction and the second quadrant M2, in which the second pattern P2 is formed, is moved to the fourth quadrant area A4. Accordingly, as illustrated in FIG. 13, the second quadrant M2, in which the second pattern P2, to which the laser light "L" is to be irradiated, is formed, may be located in the fourth quadrant area A4 that is the heating location.

In the etching operation S40, the pattern formed on the substrate "M" may be etched. In the etching operation S40, the etching may be performed on the pattern formed on the substrate "M" such that the line width of the first pattern P1 and the line width of the second pattern P2 coincide with each other. The etching operation S40 may be a critical dimension correcting process of correcting the above-described difference between the line widths of the first pattern P1 and the second pattern P2. The etching operation S40 may include a liquid treating operation S41 and a heating operation S42.

Figure 14:
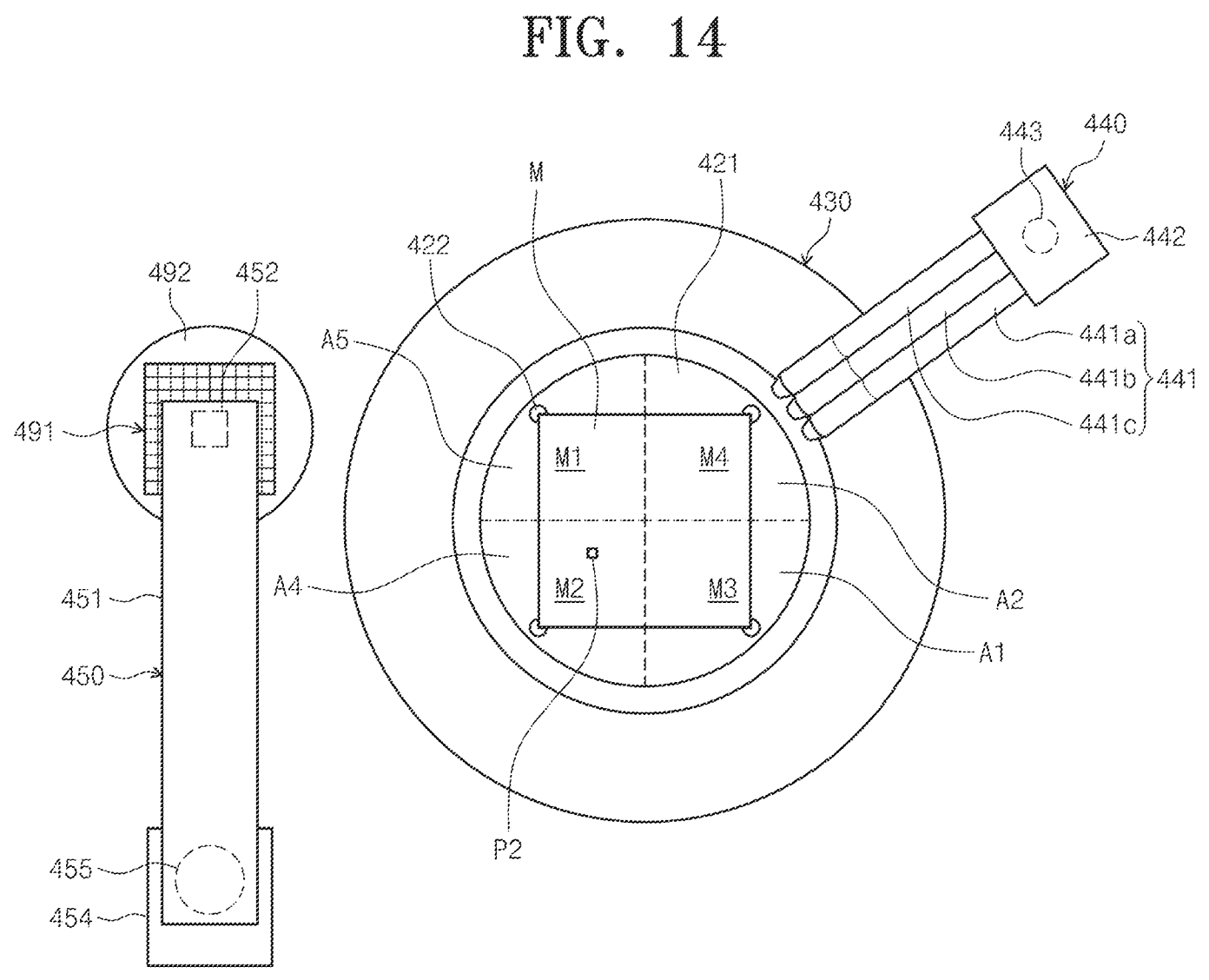

FIG. 14 is a view illustrating an appearance of the substrate treating apparatus that performs the liquid treating operation of FIG. 10. Referring to FIG. 14, the liquid treating operation S41 may be an operation of supplying a chemical that is etchant to the substrate "M", by the liquid supply unit 440. In the liquid treating operation S41, the support unit 420 may rotate the substrate "M". However, the inventive concept is not limited thereto, and in the liquid treating operation S41, the support unit 420 may not rotate the substrate "M". An amount of the chemical supplied in the liquid treating operation S41 may be large enough such that the chemical supplied onto the substrate "M" forms a puddle. For example, the amount of the chemical supplied in the liquid treating operation S41 may be large enough such that the chemical covers the entire upper surface of the substrate "M" but does not flow over from the substrate "M" or the amount of the chemical is not too large even though the chemical flows over. According to necessities, an etching liquid may be supplied to the entire upper surface of the substrate "M" while the location of the nozzle 441 is changed. After the chemical is supplied to the substrate "M" by the liquid supply unit 440, the support unit 420 may not be rotated. The support unit 420 may be stopped such that the chemical supplied onto the substrate "M" forms the puddle.

Figure 15:
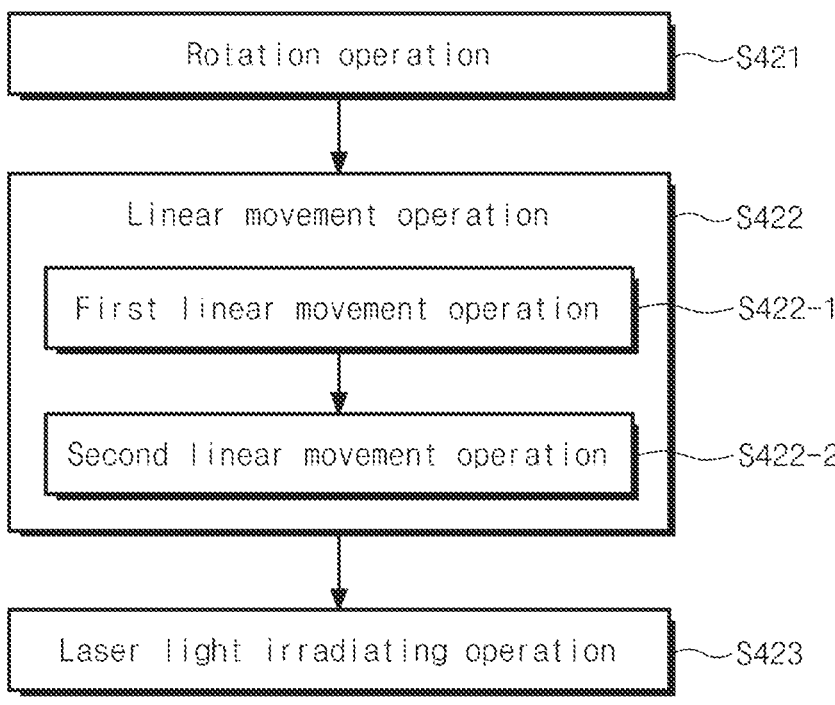
FIG. 15 is a flowchart illustrating a heating operation of FIG. 10.

FIG. 15 is a flowchart illustrating the heating operation of FIG. 10. In the heating operation S42, the substrate "M" may be heated by irradiating the laser light "L" to the substrate "M". In the heating operation S42, the substrate "M" may be heated by irradiating the laser light "L" to the substrate "M", on which the liquid film is formed as the chemical is supplied, by the heating unit 450. In the heating operation S42, the substrate "M" may be heated by irradiating the laser light "L" to the substrate "M", on which the liquid film is formed as the chemical is supplied, by the laser irradiating module 470.

In the heating operation S42, the laser light "L" may be irradiated to a specific area of the substrate "M". In the heating operation S42, the laser light "L" may be irradiated to the heating location. In the heating operation S42, the laser irradiating module 470 may be moved from the standby location to the heating location to irradiate the laser light "L" to the heating location. As an example, in the heating operation S42, the laser irradiator 452 may be moved to the fourth quadrant area A4 that is the heating location to irradiate the laser light "L" toward the second pattern P2. A temperature of the specific area, to which the laser light "L" is irradiated, may be increased. Accordingly, an etching degree by the chemical in the area, to which the laser light "L" is irradiated, may be increased. Furthermore, in the heating operation S42, the laser light "L" may be irradiated to any one of the first pattern P1 and the second pattern P2. For example, the laser light "L" may be irradiated to, among the first pattern P1 and the second pattern P2, only the second pattern P2. Accordingly, an etching performance for the second pattern P2 of the chemical is enhanced.

Accordingly, the line width of the first pattern P1 may be changed to a target line width (for example, 70 nm) at the first width (for example, 69 nm). Furthermore, the line width of the second pattern P2 may be changed to the target line width (for example, 70 nm) at the second width (for example, 68.5 nm). That is, a deviation of the line width of the pattern formed on the substrate "M" may be minimized by enhancing an etching performance for a partial area of the substrate "M".

Furthermore, according to an embodiment of the inventive concept, because the laser irradiator 452 moves the second pattern P2 to the heating location that irradiates the laser light "L" in advance, a movement distance of the laser irradiating module 470 may be minimized. Accordingly, a movement stroke of the laser irradiating module 470 may be minimized whereby a structure of the heating unit 450 may be simplified. Accordingly, a structure of the liquid treatment chamber 400 may be simplified. Furthermore, because the laser irradiator 452 is moved only by a minimum distance, a problem, in which a shape of the light of the laser irradiating module 470 is changed or the irradiation location of the light is distorted, which may occur in a process the laser irradiator 452 being moved to the irradiation location, may be minimized.

Referring to FIG. 15, the heating operation S42 may include a rotation operation S421, a linear movement operation S422, and a laser light irradiating operation S423. The linear movement operation S422 may include a first linear movement operation S422-1 and a second linear movement operation S422-2. In the heating operation S42, the rotation operation S421, the first linear movement operation S422-1, the second linear movement operation S422-2, and the laser light irradiating operation S423 may be sequentially performed.

Figure 16:
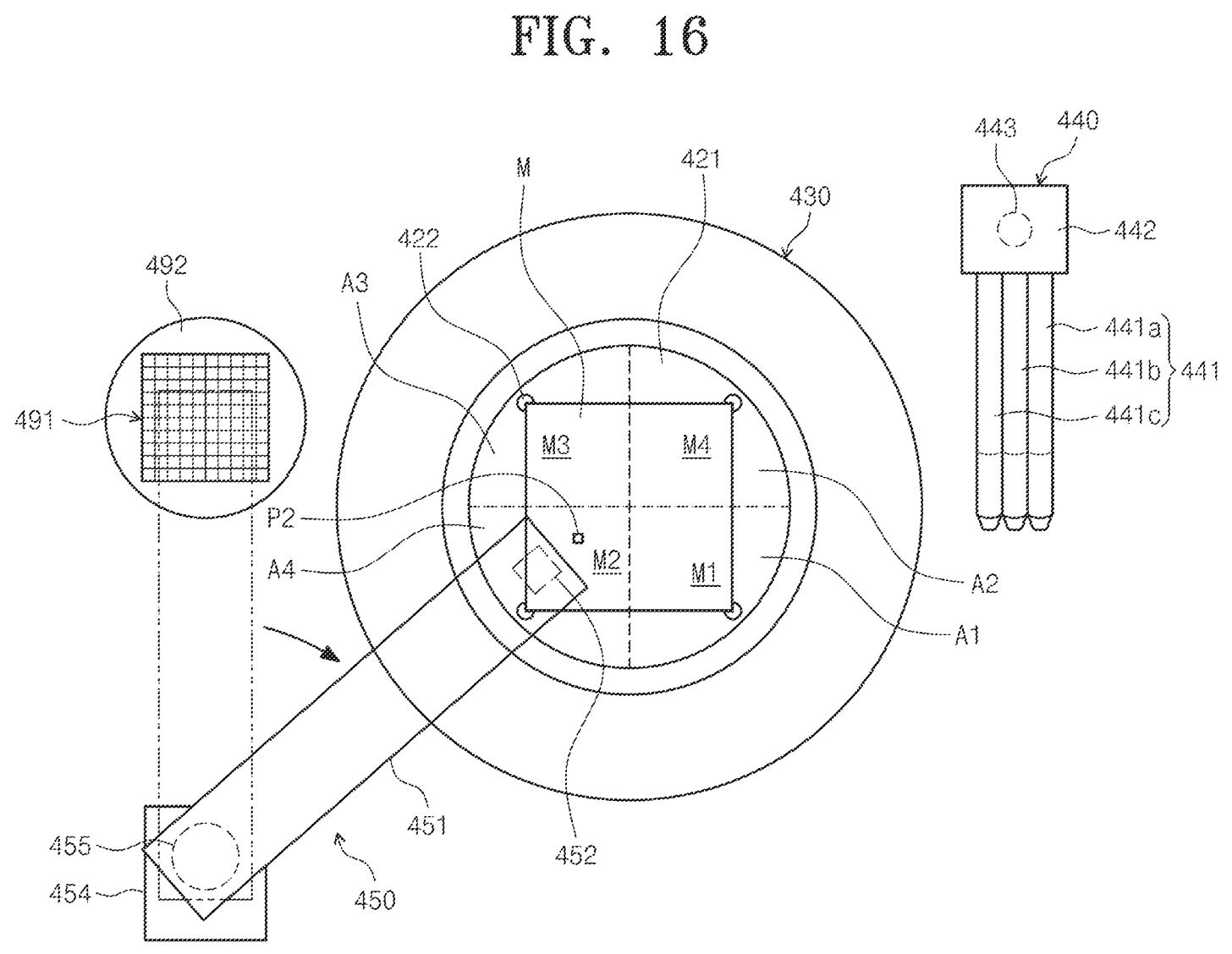

FIG. 16 is a view illustrating an appearance of the substrate treating apparatus that performs the rotation operation of FIG. 15. Referring to FIG. 16, in the rotation operation S421, the heating unit 450 may be rotated at a specific angle by the rotation part 455 of the movement module. In the rotation operation S421, the heating unit 450 may be rotated about the shaft 456 by the rotation part 455. Accordingly, the laser irradiator 452 may be located within the heating location. The laser irradiator 452 may be located in the fourth quadrant area A4.

Figure 17:
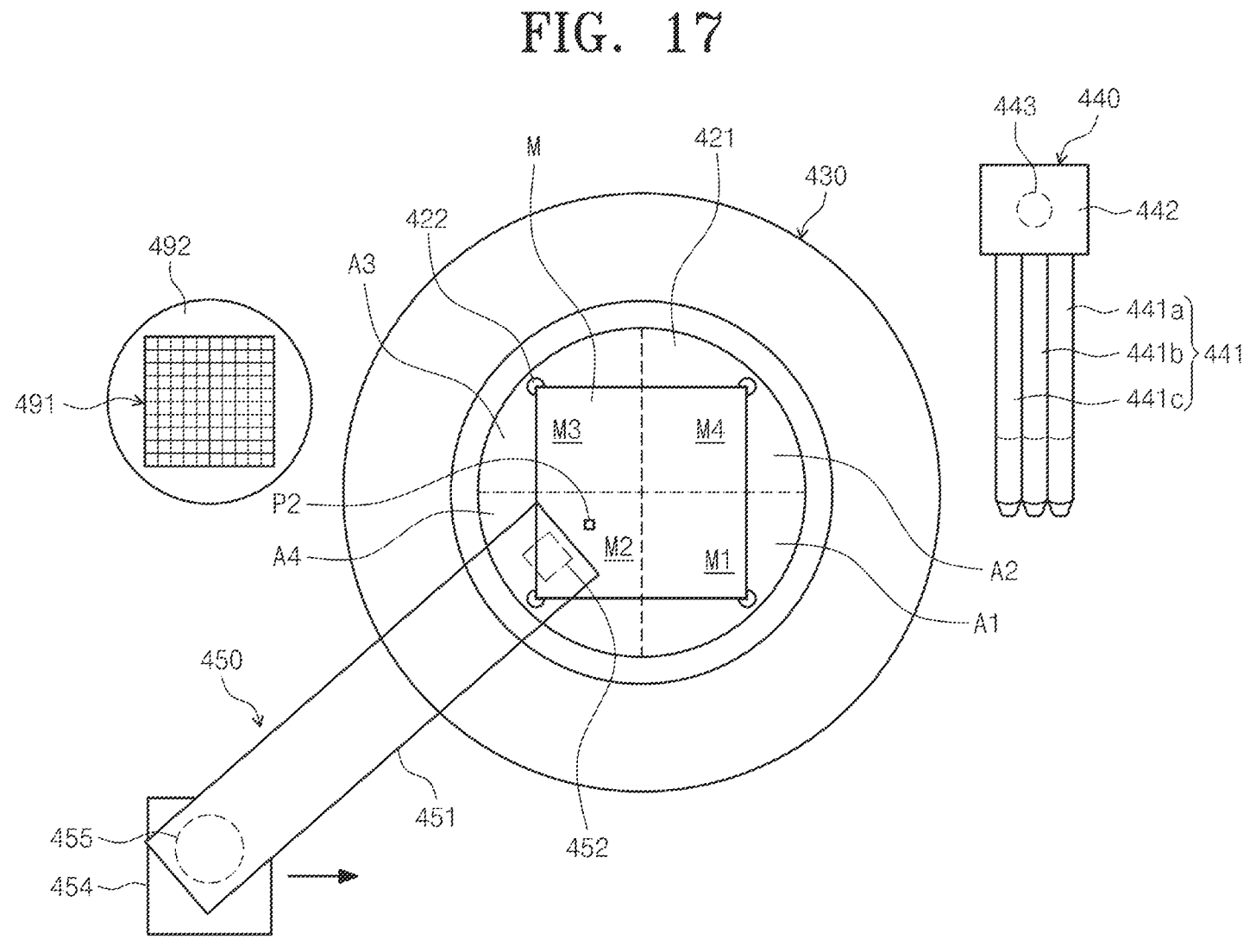

FIG. 17 is a view illustrating an appearance of the substrate treating apparatus that performs the first linear movement operation of FIG. 15. Referring to FIG. 17, in the first linear movement operation S422-1, the heating unit 450 may be linearly moved in the first direction by the first driver 453. Then, the heating unit 450 may be moved in the first direction within a first movement distance range. In FIG. 17, the first driver 453 may move the heating unit 450 by a distance between an imaginary line that passes a center point of the laser irradiator 452 in the second direction and an imaginary line that passes through a center point of the second pattern P2 in the second direction. Accordingly, as illustrated in FIG. 18, the imaginary line that passes the center point of the laser irradiator 452 in the second direction and the imaginary line that passes through the center point of the second pattern P2 in the second direction may coincide with each other.

Figure 18:
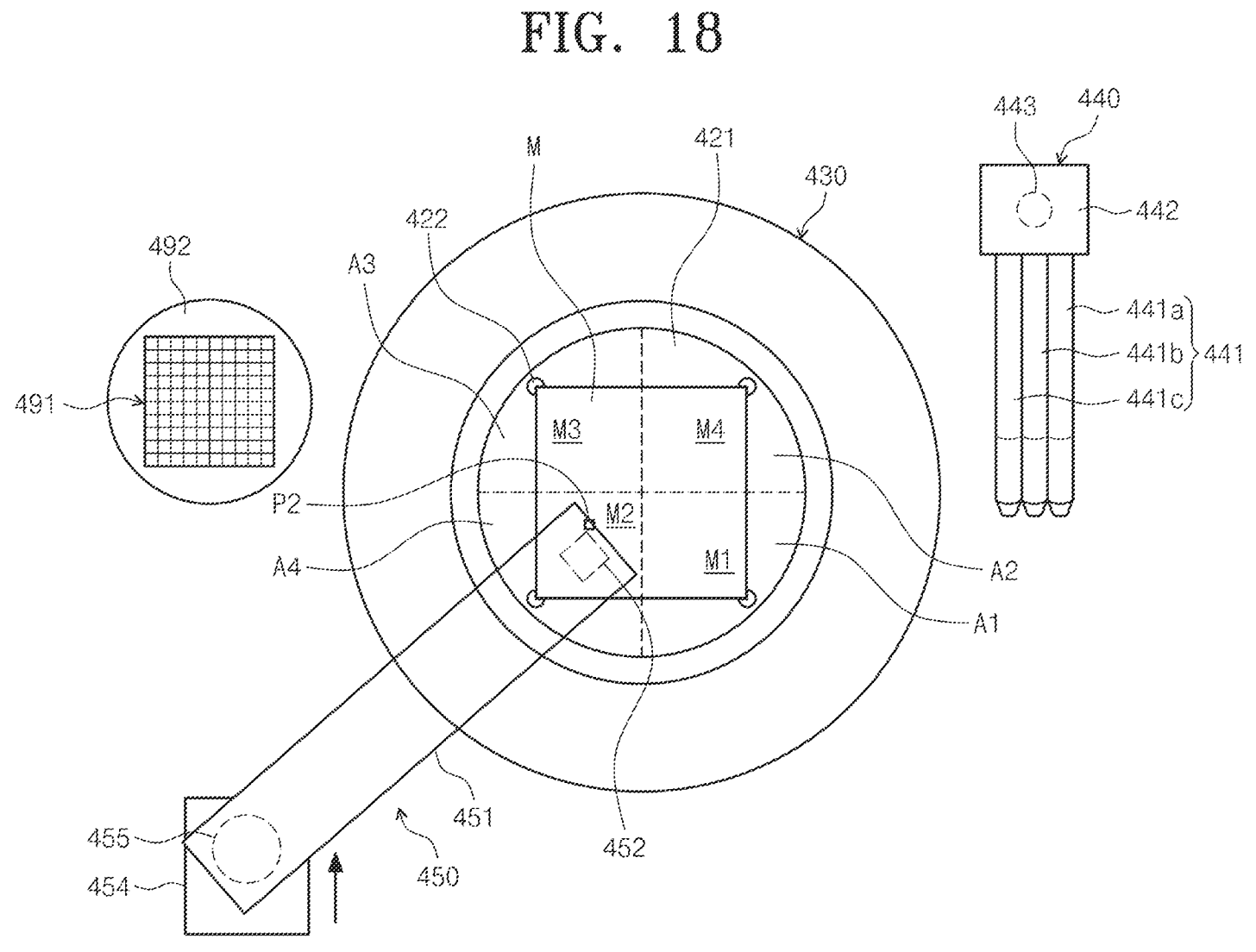

FIG. 18 is a view illustrating an appearance of the substrate treating apparatus that performs the second linear movement operation of FIG. 15. Referring to FIG. 18, in the second linear movement operation S422-2, the heating unit 450 may be linearly moved in the second direction by the second driver 454. Then, the heating unit 450 may be moved in the second direction within a second movement distance range. In FIG. 18, the second driver 454 may move the heating unit 450 by a distance between an imaginary line that passes a center point of the laser irradiator 452 in the first direction and a an imaginary line that passes through a center point of the second pattern P2 in the first direction. Accordingly, the imaginary line that passes the center point of the laser irradiator 452 in the first direction and the imaginary line that passes through the center point of the second pattern P2 in the first direction may coincide with each other. Furthermore, accordingly, as illustrated in FIG. 19, the center point of the laser irradiator 452 and the center point of the second pattern P2 may coincide with each other.

Figure 19:
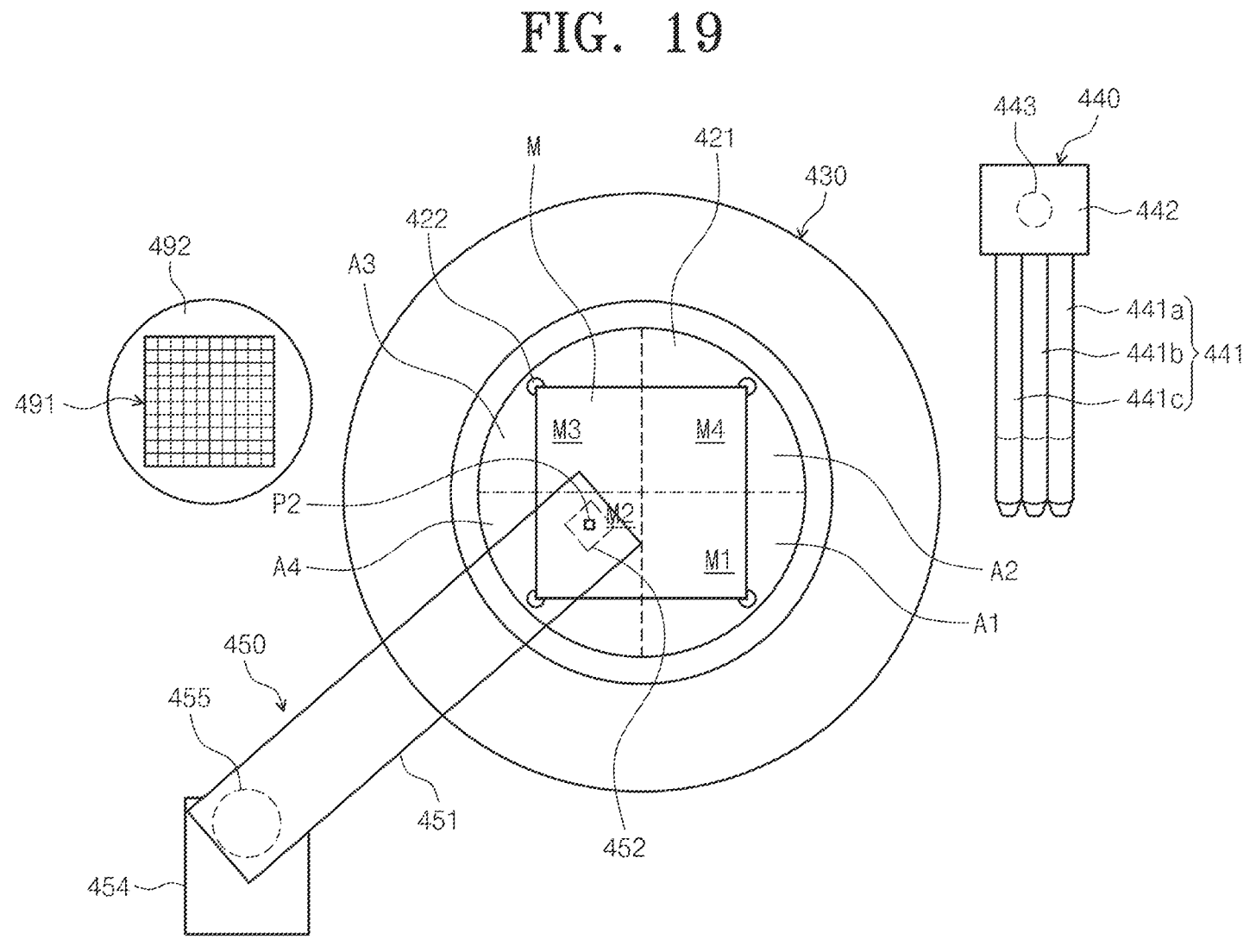

FIG. 19 is a view illustrating an appearance of the substrate treating apparatus that performs the laser light irradiating operation of FIG. 15. Referring to FIG. 19, when the center point of the laser irradiator 452 and the center point of the second pattern P2 coincide with each other, the laser light "L" may be irradiated to the second pattern P2 through the laser irradiator 452.

In the rinsing operation S50, process by-products generated in the etching operation S40 may be removed from the substrate "M". In the rinsing operation S50, the process by-products formed on the substrate "M" may be removed by supplying a rinsing liquid "R" to the rotating substrate "M". According to the necessities, to dry the rinsing liquid "R" that resides on the substrate "M", the support unit 420 may remove the rinsing liquid "R" that resides on the substrate "M" by rotating the substrate "M" at a high speed.

In the substrate carrying-out operation S60, the substrate "M" that has been treated may be carried out from the interior space 412. In the substrate carrying-out operation S60, the door may open a carrying-in/out hole formed in the housing 410. Furthermore, in the substrate carrying-out operation S60, the transfer robot 320 may unload the substrate "M" from the support unit 420, and may carry the unloaded substrate "M out of the interior space 412.

Although it has been illustrated and described above that the first linear movement operation S422-1 is performed first and the second linear movement operation S422-2 is performed later, the inventive concept is not limited thereto, and the second linear movement operation S422-2 corresponding to a linear movement in the second direction is performed first, and the first linear movement operation S422-1 corresponding to a linear movement in the first direction may be performed later.

Furthermore, although it has been described above that the laser light "L" is irradiated when the center point of the laser irradiator 452 and the center point of the second pattern P2 coincide with each other in the heating operation S42, the inventive concept is not limited thereto, and the heating operation S42 may be performed even though they do not partially coincide with each other within an error range.

To irradiate the laser light "L" to the target location on the substrate "M", it is necessary to accurately locate the laser irradiator 452 of the heating unit 450 at the target location. Operation means for moving the heating unit 450 includes a swing stage that rotates the heating unit 450 and a perpendicular stage that perpendicularly moves the heating unit 450. The swing stage may miniaturize devices, but a movement range thereof is limited whereby it is difficult to locate the laser irradiator 452 at an accurate target location. The perpendicular stage may accurately locate the laser irradiator 452 at the target location because a movement range thereof is not limited, but a size of a device increases because a rail for moving the heating unit in the first direction and the second direction is necessary.

However, according to an embodiment of the inventive concept, because the movement module that moves the heating unit 450 includes the swing stage and the perpendicular stage, the device of the swing state may be miniaturized and may be positioned at an accurate location of the perpendicular state. In detail, after the laser irradiator 452 is located at the heating location (the fourth quadrant area A4) by using the swing stage, the laser irradiator 452 may be located at an accurate location by using the perpendicular stage. Then, because the quadrant of the substrate "M", in which a pattern, to which the laser light "L" is to be irradiated, is located at the heating location (the fourth quadrant area A4) in advance in the location correcting operation, a maximum stroke of the perpendicular stage may be reduced. For example, a maximum stroke in the first direction is a length of one of the four quadrants of the substrate "M" in the first direction, and a maximum stroke in the second direction is a length of one of the four quadrants of the substrate "M" in the second direction. Because the maximum stroke is reduced in the perpendicular stage, the device may be miniaturized while having an advantage (positioning at an accurate location) of the perpendicular stage. Accordingly, an interior space efficiency of the liquid treatment chamber 400 may be increased.

According to an embodiment of the inventive concept, a substrate treating apparatus that may efficiently treat a substrate, and a substrate treating method may be provided.

Furthermore, according to an embodiment of the inventive concept, line widths of pattern formed on a substrate may be made uniform.

Furthermore, according to an embodiment of the inventive concept, specific pattern formed on a substrate may be precisely etched.

Furthermore, according to an embodiment of the inventive concept, a structure of a heating unit that irradiates laser light onto a substrate may be minimized.

Furthermore, according to an embodiment of the inventive concept, a movement stroke may be minimized when a heating unit that irradiates laser light onto a substrate is moved to a target location.

Furthermore, according to an embodiment of the inventive concept, a size of a heating unit that irradiates laser light onto a substrate may be reduced.

Furthermore, according to an embodiment of the inventive concept, a spatial utility in a liquid treatment chamber may be reduced through reduction of a size of a heating unit.

The effects of the embodiments of the inventive concept are not limited to the above-mentioned effects, and the unmentioned effects can be clearly understood by those skilled in the art, to which the embodiments of the inventive concept pertain, from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:

a support unit configured to support and rotate a substrate;

a heating unit housing a camera module and a laser irradiator, the laser irradiator configured to irradiate laser light in a pattern formed in the substrate;

a movement module configured to change a location of the laser irradiator by moving the heating unit; and a controller configured to control the support unit and the heating unit, wherein the movement module moves the heating unit between a heating location, at which the laser light is irradiated to the substrate, and a standby location that deviates from the substrate, wherein the movement module rotates and linearly moves the heating unit, wherein the camera module acquires an image when the laser light is irradiated to the substrate, wherein the controller adjusts a position of the laser irradiator based on the image acquired by the camera module when the laser light is irradiated to the substrate, wherein the substrate has a plurality of cells, the pattern formed in the substrate includes a first pattern and a second pattern, the first pattern is formed in the plurality of cells, and the second pattern is formed on an outer side of the area, in which the plurality of cells are formed, wherein the controller controls the movement module to rotate the heating unit to position the laser irradiator at a heating location corresponding to a quadrant of the substrate in which the second pattern is located and to linearly move the heating unit to align the laser irradiator with the second pattern, wherein the second pattern is pre-positioned at the heating location such that a maximum stroke of the movement module during linear movement is reduced, wherein the laser irradiator irradiates the laser light to, among the first pattern and the second pattern, the second pattern, and when the laser irradiator is located within the heating location, a center point of the laser irradiator and a center point of the second pattern coincide with each other.

2. The substrate treating apparatus of claim 1, wherein the movement module includes:

a perpendicular movement part configured to linearly move the heating unit; and a rotation part configured to rotate the heating unit, wherein the perpendicular movement part includes:

a first driver configured to move the heating unit in a first direction; and a second driver configured to move the heating unit in a second direction that is perpendicular to the first direction.

3. The substrate treating apparatus of claim 2, wherein the movement module further includes a shaft, and wherein the shaft is disposed between the perpendicular movement part and the rotation part.

4. The substrate treating apparatus of claim 3, wherein the laser irradiator is disposed at one end of a bottom surface of the heating unit, wherein the rotation part is disposed at an opposite end of the bottom surface of the heating unit, and wherein the movement module rotates the heating unit while the shaft is taken as an axis thereof.

5. The substrate treating apparatus of claim 1, wherein the substrate includes a plurality of division surfaces, wherein the pattern is located on any one of the plurality of division surfaces of the substrate, and wherein the controller rotates the support unit such that the division surface of the substrate, on which the pattern is located, is located in an area that is adjacent to the heating unit.

6. The substrate treating apparatus of claim 5, wherein the laser irradiator is moved by the first driver by a first movement distance in the first direction, and wherein the first movement distance corresponds to a length of the one of the plurality of division surfaces of the substrate in the first direction.

7. The substrate treating apparatus of claim 6, wherein the laser irradiator is moved by the second driver by a second movement distance in the second direction, and wherein the second movement distance corresponds to a length of the one of the plurality of division surfaces of the substrate in the second direction.

8. The substrate treating apparatus of claim 1, wherein the controller controls the heating unit such that a deviation between a line width of the first pattern and a line width of the second pattern is minimized by irradiating the laser light to the second pattern.

9. The substrate treating apparatus of claim 1, wherein the first pattern is a monitoring pattern of an exposure pattern formed in the cell, and the second pattern is a condition setting pattern of the substrate treating apparatus.

10. The substrate treating apparatus of claim 1, wherein the controller controls the movement module such that the heating unit is moved perpendicularly after being rotated.

* * * * *